(12) United States Patent
Wu

(10) Patent No.: US 12,374,405 B2
(45) Date of Patent: Jul. 29, 2025

(54) MEMORY DEVICE HAVING INTERFACE CHARGE TRAPS

(71) Applicant: Taiwan Semiconductor Manufacturing Company, Ltd., Hsinchu (TW)

(72) Inventor: Chao-I Wu, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 172 days.

(21) Appl. No.: 18/149,729

(22) Filed: Jan. 4, 2023

(65) Prior Publication Data

US 2024/0145011 A1  May 2, 2024

Related U.S. Application Data

(60) Provisional application No. 63/420,112, filed on Oct. 28, 2022.

(51) Int. Cl.
*G11C 16/12* (2006.01)
*G11C 16/34* (2006.01)

(52) U.S. Cl.
CPC .......... *G11C 16/12* (2013.01); *G11C 16/3404* (2013.01)

(58) Field of Classification Search
CPC ..... G11C 16/12; G11C 16/3404; G11C 11/22; G11C 11/221
See application file for complete search history.

(56) References Cited

U.S. PATENT DOCUMENTS

| | | | |
|---|---|---|---|
| 9,875,784 B1 | 1/2018 | Li et al. | |
| 2019/0287980 A1* | 9/2019 | Yoo | H10B 51/30 |
| 2019/0288116 A1* | 9/2019 | Yoo | H01L 29/161 |
| 2020/0098925 A1* | 3/2020 | Dewey | H01L 29/78391 |
| 2020/0303417 A1 | 9/2020 | Teo et al. | |
| 2021/0399014 A1 | 12/2021 | Wu et al. | |
| 2021/0408013 A1* | 12/2021 | Young | G11C 11/161 |
| 2022/0189546 A1* | 6/2022 | Gong | G11C 11/223 |
| 2022/0238537 A1 | 7/2022 | Dowben et al. | |
| 2022/0343962 A1 | 10/2022 | Trantham et al. | |

OTHER PUBLICATIONS

Mo et al. "Low-Voltage Operating Ferroelectric FET with Ultrathin IGZO Channel for High-Density Memory Application" IEEE Journal of the Electron Devices Society (vol. 8), published on Jul. 13, 2020.

* cited by examiner

*Primary Examiner* — Han Yang
(74) *Attorney, Agent, or Firm* — Eschweiler & Potashnik, LLC

(57) ABSTRACT

An integrated chip including a substrate. A gate layer is over the substrate. A channel layer is over the substrate and vertically spaced apart from the gate layer. A ferroelectric layer is directly between the channel layer and the gate layer. A pair of source/drain electrodes are laterally spaced apart over the channel layer. A plurality of charge traps are along an interface between the ferroelectric layer and the channel layer.

20 Claims, 14 Drawing Sheets

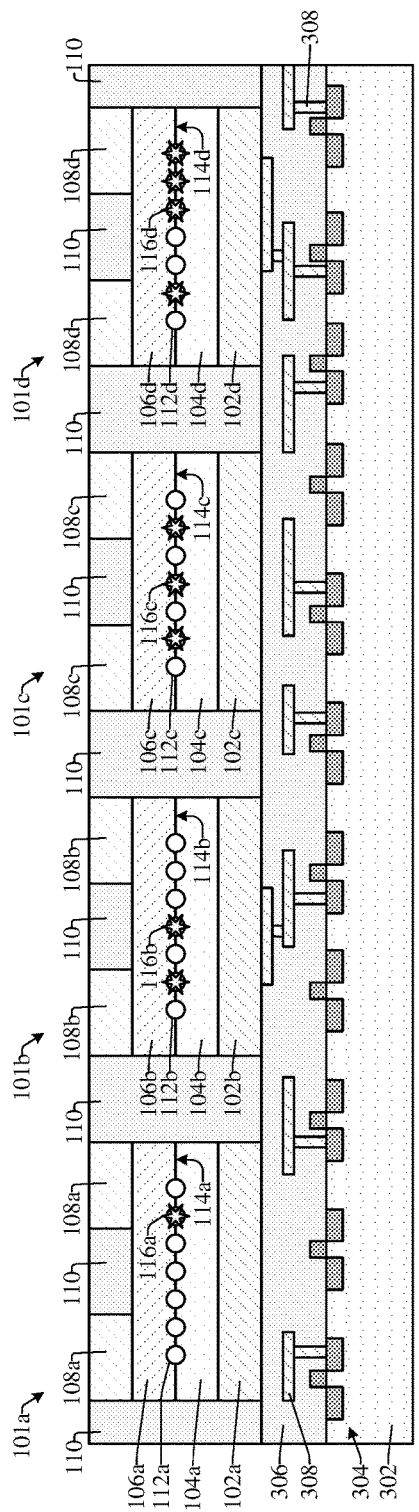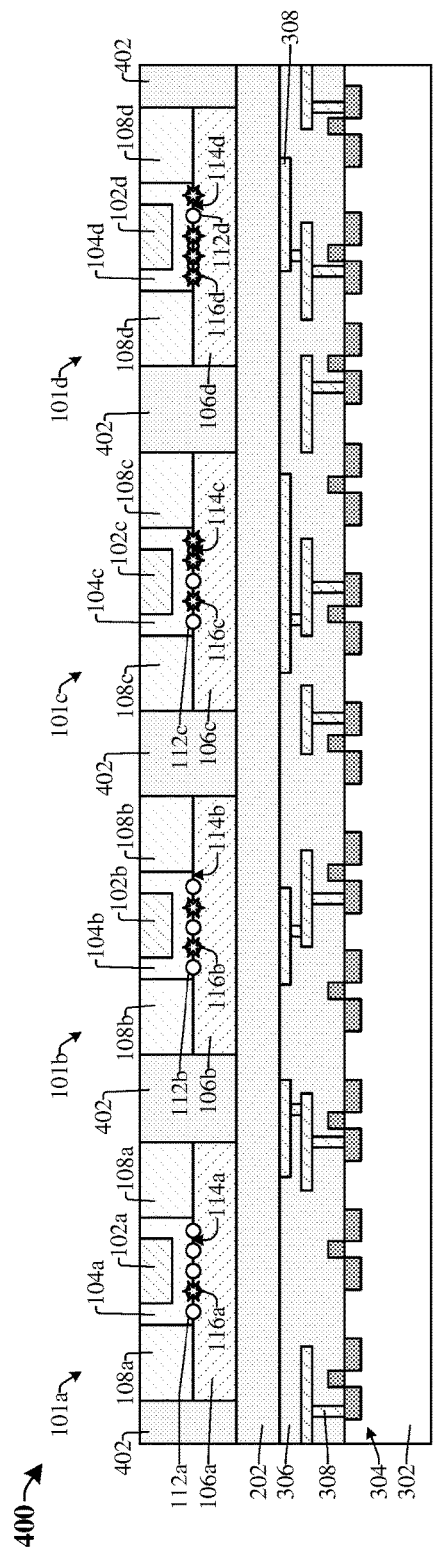
Fig. 3
Fig. 4

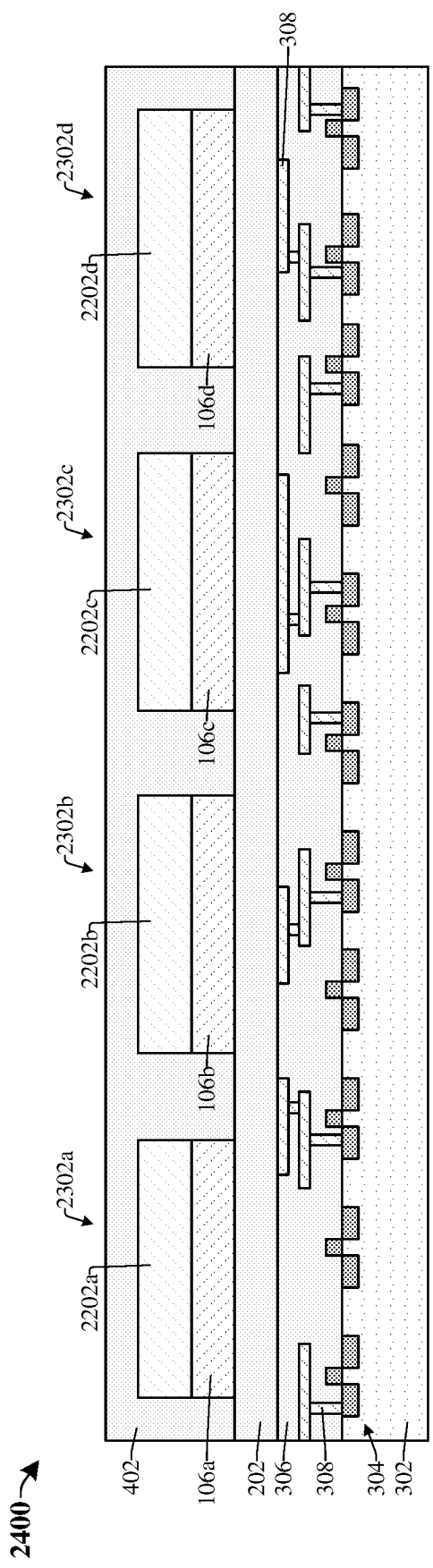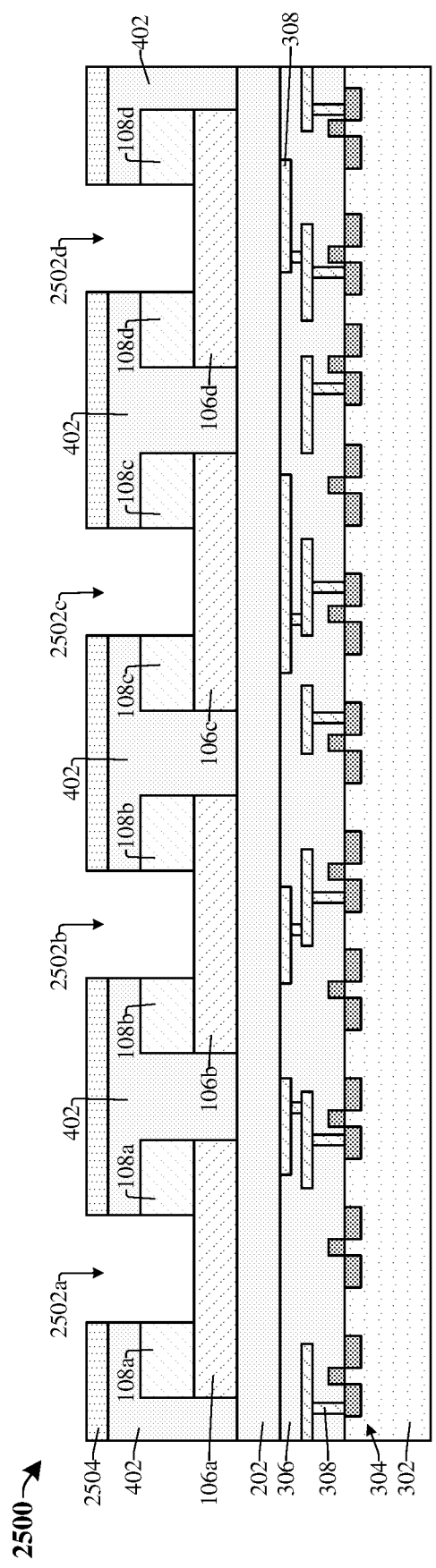

MEMORY DEVICE HAVING INTERFACE CHARGE TRAPS

REFERENCE TO RELATED APPLICATION

This application claims the benefit of U.S. Provisional Application No. 63/420,112, filed on Oct. 28, 2022, the contents of which are hereby incorporated by reference in their entirety.

BACKGROUND

Many electronic devices contain a multitude of transistor devices. Some transistor devices include metal oxide semiconductor field effect transistors (MOSFETs). A transistor device includes a gate arranged between a source and a drain. Transistor devices may be categorized as high voltage (HV), medium voltage (MV) or low voltage (LV) devices, depending on the magnitude of the voltage applied to the gate to turn the transistor on. The structural design parameters of each transistor in an electronic device vary depending on the desired electrical properties. Some transistor devices form memory devices. Memory devices include volatile memory (e.g., random access memory (RAM)) and non-volatile memory (e.g., read-only memory (ROM)).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a cross-sectional view of some embodiments of an integrated chip comprising a plurality of the memory device of FIG. 1A.

FIG. 4 illustrates a cross-sectional view of some embodiments of an integrated chip comprising a plurality of the memory device of FIG. 2.

FIGS. 18-29 illustrate cross-sectional views of some other embodiments of a method for forming an integrated chip comprising a plurality of memory devices over a substrate.

DETAILED DESCRIPTION

Figure 1A:
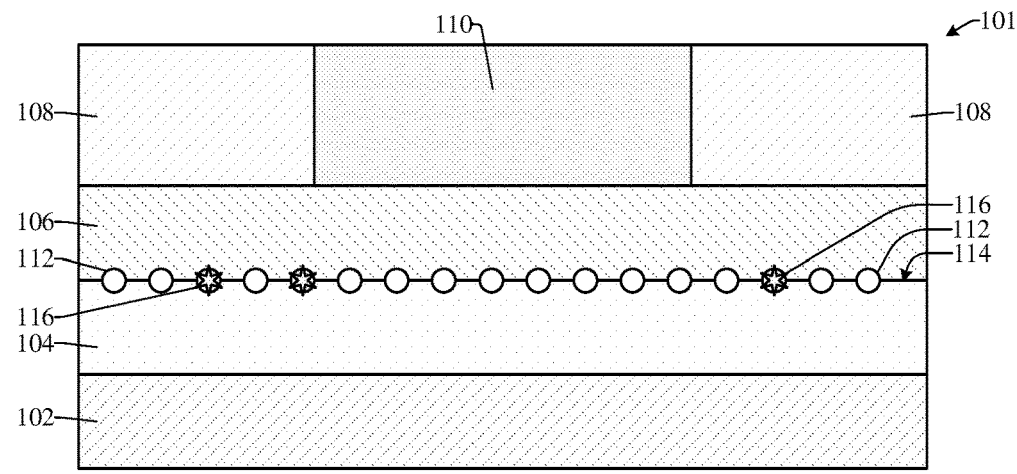
FIG. 1A illustrates a cross-sectional view of some embodiments of a memory device comprising a plurality of charge traps along an interface between a ferroelectric layer and a channel layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated chips include one-time programmable (OTP) memory devices which can store permanent data after being initially programmed (e.g., programmed one time). For example, an OTP memory device includes a polysilicon gate over a channel that extends between a pair of source/drain regions. A gate oxide is between the gate and the channel. The polysilicon gate has a first region and a second region. The second region is closer to the channel than the first region. The gate functions as an anti-fuse. For example, when a large enough voltage is applied to the gate, breakdown of the gate oxide occurs along the second region of the gate and the second region of the gate is shorted to the channel. The memory device represents a first value (e.g., 0) when the memory device is in its initial state (e.g., before the gate oxide breakdown) and a second value (e.g., 1) after when the memory device is in the shorted state (e.g., after the gate oxide breakdown).

A challenge with these memory devices is that they require high voltage for programming. For example, a relatively high voltage may be required to short the gate to the channel to program the memory device. Another challenge with these memory devices is that may be relatively large in size. For example, a size of the memory device may be increased to accommodate the anti-fuse structure.

Various embodiments of the present disclosure are related to a memory device comprising a plurality of charge traps along an interface between a ferroelectric layer and a channel layer for reducing a programming voltage and a size of the memory device. For example, the memory device includes a gate layer, the ferroelectric layer, the channel layer, and a pair of source/drain electrodes. The ferroelectric layer is directly between the channel layer and the gate layer. The pair of source/drain electrodes are laterally spaced apart over the channel layer. The plurality of charge traps are along an interface between the ferroelectric layer and the channel layer.

The memory device can be programmed by applying a voltage to the gate layer. For example, applying a program voltage to the gate layer causes charge carriers (e.g., electrons) become trapped in the charge traps (e.g., electron traps) along the interface. The trapping of the charge carriers along the interface causes a threshold voltage of the device to shift from an initial (e.g., first) threshold voltage to a shifted (e.g., second) threshold voltage. The threshold voltage of the device indicates the state of the device. For example, a device having the initial threshold voltage represents a first stored value (e.g., 0) and a device having a shifted threshold voltage represents a second stored value (e.g., 1).

A magnitude of the first program voltage can be low (e.g., 2 volts or less). For example, a relatively low voltage can attract the charge carriers toward the interface where they become trapped by the charge traps. Thus, the voltage required to program the device can be reduced (e.g., relative to a voltage required to breakdown an anti-fuse device). Further, the dimensions of the gate layer, the ferroelectric layer, the channel layer, and the source/drain electrodes can be relatively small. Thus, a size of the memory device can be reduced (e.g., relative to the size of the anti-fuse device).

Figure 1B:
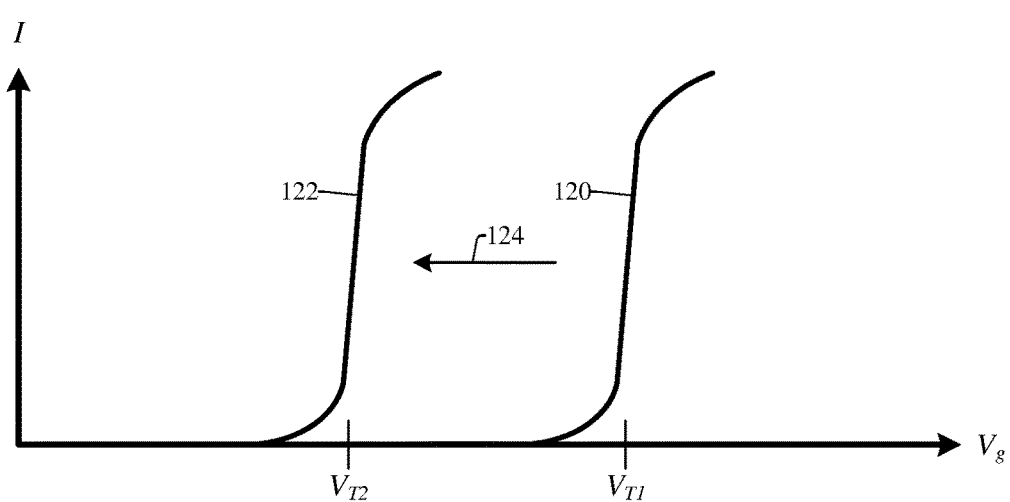
FIG. 1B illustrates a plot of some embodiments of a current through the memory device of FIG. 1 versus a gate voltage of the memory device of FIG. 1.

FIG. 1A illustrates a cross-sectional view 100a of some embodiments of a memory device 101 comprising a plurality of charge traps 112 along an interface 114 between a ferroelectric layer 104 and a channel layer 106. FIG. 1B illustrates a plot 100b of some embodiments of a current I through the memory device of FIG. 1A versus a gate voltage Vg of the memory device of FIG. 1A.

The memory device 101 includes a gate layer 102, the ferroelectric layer 104, the channel layer 106, and a pair of source/drain electrodes 108 (e.g., a first source/drain electrode and a second source/drain electrode). The channel layer 106 is vertically spaced apart from the gate layer 102. The ferroelectric layer 104 is directly between the channel layer 106 and the gate layer 102. In some embodiments, the ferroelectric layer 104 is directly over the gate layer 102 and the channel layer 106 is directly over the ferroelectric layer 104. The channel layer 106 and the ferroelectric layer 104 meet at an interface 114. The pair of source/drain electrodes 108 are laterally spaced apart over the channel layer 106. A dielectric layer 110 is laterally between the pair of source/drain electrodes 108.

The plurality of charge traps 112 are along the interface 114 between the channel layer 106 and the ferroelectric layer 104. The charge traps 112 are capable of trapping charge carriers 116 along the interface 114. In some embodiments, the charge traps 112 are electron traps and the charge carriers 116 are electrons. In some embodiments, a first number of the charge traps 112 are vacant and a second number of the charge traps 112 are filled with (e.g., contain) a corresponding number of charge carriers 116.

The memory device 101 can be programmed by applying a program voltage to the gate layer 102. For example, applying the program voltage to the gate layer 102 causes charge carriers 116 in the channel layer 106 to be attracted toward the gate layer 102. When the charge carriers 116 reach the interface 114, some of the charge carriers 116 will become trapped by the charge traps 112 along the interface 114, thereby increasing the number of charge carriers 116 which are trapped in the charge traps 112 along the interface 114. As a result, a threshold voltage of the memory device 101 to can be shifted (e.g., as illustrated by arrow 124) from an initial (e.g., first) threshold voltage $V_{T1}$ (e.g., corresponding to a first I-V curve 120) to a shifted (e.g., second) threshold voltage $V_{T2}$ (e.g., corresponding to a second I-V curve 122), as illustrated in FIG. 1B. The threshold voltage of the memory device 101 corresponds to the number of charge carriers 116 trapped along the interface 114 and indicates the value stored in the memory device 101. For example, a memory device having the initial threshold voltage $V_{T1}$ (corresponding to a first number of trapped charge carriers 116) represents a first stored value (e.g., 0) and a device having a shifted threshold voltage $V_{T2}$ (corresponding to a second number of trapped charge carriers 116) represents a second stored value (e.g., 1).

A program voltage having a relatively low magnitude (e.g., less than or equal to 2 volts) can be used to trap the charge carriers 116 along the interface 114. Thus, the voltage required to program the memory device 101 can be reduced. Further, the gate layer, the ferroelectric layer, the channel layer, and the source/drain electrodes can have relatively small dimensions. Thus, a size of the memory device can be reduced.

The memory device 101 can be read (e.g., the value programmed in the memory device 101 can be determined) by determining the threshold voltage of the memory device 101. For example, in some embodiments, the threshold voltage of the memory device 101 can be determined by applying a plurality of read voltages to the gate layer 102 and determining at which of the read voltages the memory device 101 turns on (e.g., conducts substantial current between the source/drain electrodes).

In some instances, the charge traps 112 are substantially deep. As a result, a likelihood of the trapped charge carriers 116 being freed from the charge traps 112 is low. Thus, a likelihood of the threshold voltage of the memory device 101 shifting back to the initial threshold voltage from a shifted threshold voltage is low. Thus, in some embodiments, the shifting of the threshold voltage of the memory device 101 may be referred to as being "permanent". Consequently, the memory device 101 may be referred to as a one-time programmable (OTP) memory device.

In some embodiments, the program voltage applied to the gate layer 102 to program the memory device 101 is a positive voltage so that the charge carriers 116 trapped along the interface 114 as a result of the program voltage are negative charge carriers (e.g., electrons). Trapping negative charge carriers along the interface 114 causes the shift in threshold voltage to be in the negative direction. For example, the shifted threshold voltage $V_{T2}$ is less than the initial threshold voltage $V_{T1}$ (e.g., as illustrated in FIG. 1B). Reducing the threshold voltage of the memory device 101 increases the current through the memory device 101. Increasing the current though the memory device 101 can increase the speed of the memory device 101 (e.g., the write speed, the read speed, or the like). Thus, by applying a positive program voltage to the gate layer 102 to program the memory device, the performance of the memory device 101 can be improved.

In some embodiments, the gate layer 102 comprises tungsten, aluminum, copper, or some other suitable material. In some embodiments, the ferroelectric layer 104 comprises hafnium zirconium oxide (HZO) or some other suitable material. In some embodiments, the channel layer 106 comprises a metal oxide semiconductor such as, for example, indium gallium zinc oxide, zinc oxide, tin oxide, indium tin oxide, nickel oxide, or some other suitable material. In some embodiments, the dielectric layer 110 comprises silicon dioxide or some other suitable material. In some embodiments, the source/drain electrodes 108 comprise tungsten, copper, aluminum, titanium, or some other suitable material. Source/drain electrode(s) (e.g., 108) may refer to a source or a drain, individually or collectively dependent upon the context.

Figure 2:
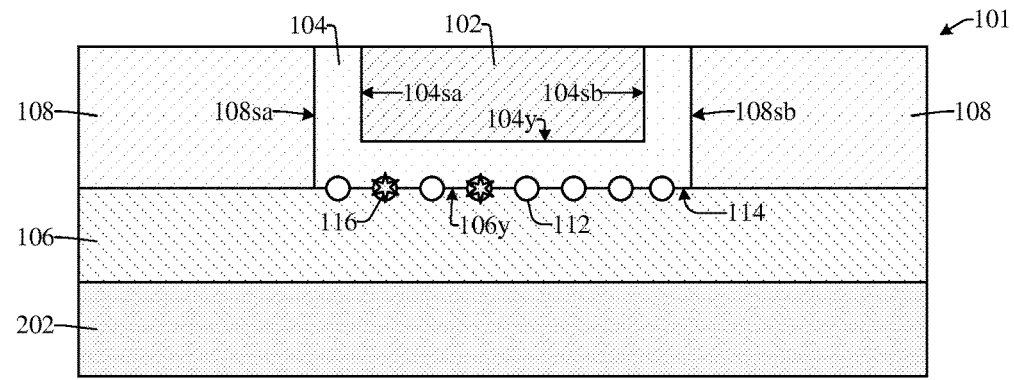
FIG. 2 illustrates a cross-sectional view of some embodiments of the memory device of FIG. 1A in which a gate layer is over the channel layer.

FIG. 2 illustrates a cross-sectional view 200 of some embodiments of the memory device 101 of FIG. 1A in which the gate layer 102 is over the channel layer 106.

The channel layer 106 is over a dielectric layer 202. The pair of source/drain electrodes 108 are laterally spaced apart over the channel layer 106. The ferroelectric layer 104 is over the channel layer 106 and laterally between the pair of source/drain electrodes 108. For example, the ferroelectric layer 104 extends along a sidewall 108sa of a first source/drain electrode of the pair of source/drain electrodes 108, an upper surface 106y of the channel layer 106, and a sidewall 108sb of a second source/drain electrode of the pair of source/drain electrodes 108. The gate layer 102 is over the ferroelectric layer 104, laterally between the pair of source/drain electrodes 108, and laterally between sidewalls of the ferroelectric layer 104. For example the gate layer 102 extends along a first inner sidewall 104sa of the ferroelectric layer 104, an upper surface 104y of the ferroelectric layer 104, and a second inner sidewall 104sb of the ferroelectric layer 104. The charge traps 112 are along the interface 114 between the ferroelectric layer 104 and the channel layer 106.

Figure 5:
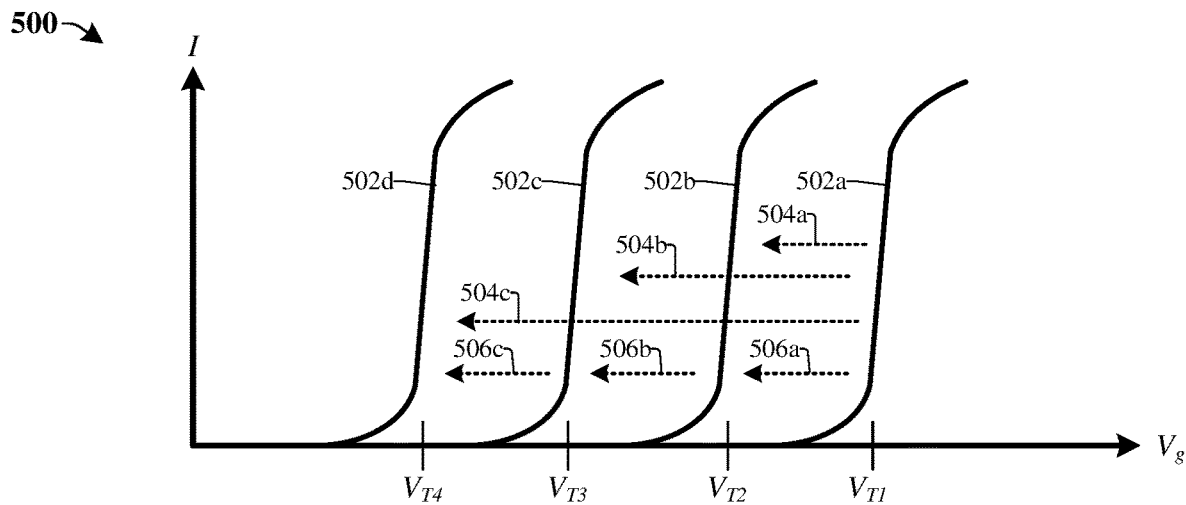
FIG. 5 illustrates a plot of some embodiments of a current through the memory devices of FIG. 3 and/or FIG. 4 versus a gate voltage of the memory devices of FIG. 3 and/or FIG. 4.

FIG. 3 illustrates a cross-sectional view 300 of some embodiments of an integrated chip comprising a plurality of the memory device 101 of FIG. 1A. FIG. 4 illustrates a cross-sectional view 400 of some embodiments of an integrated chip comprising a plurality of the memory device 101 of FIG. 2. FIG. 5 illustrates a plot 500 of some embodiments of a current I through the memory devices of FIG. 3 and/or FIG. 4 versus a gate voltage Vg of the memory devices of FIG. 3 and/or FIG. 4.

In some embodiments, the integrated chip comprises a first memory device 101a, a second memory device 101b, a third memory device 101c, and a fourth memory device 101d. The memory devices comprise gate layer segments 102a, 102b, 102c, 102d, ferroelectric layer segments 104a, 104b, 104c, 104d, channel layer segments 106a, 106b, 106c, 106d, charge traps 112a, 112b, 112c, 112d along interfaces 114a, 114b, 114c, 114d, and pairs of source/drain electrodes 108a, 108b, 108c, 108d. For example, the first memory device 101a comprises a first gate layer segment 102a, a first ferroelectric layer segment 104a, a first channel layer segment 106a, a plurality of first charge traps 112a along a first interface 114a between the first channel layer segment 106a and the first ferroelectric layer segment 104a, and a first pair of source/drain electrodes 108a.

The memory devices 101a, 101b 101c, 101d are arranged over a substrate 302. In some embodiments, a plurality of transistor devices 304 are arranged along an upper surface of the substrate 302. In some embodiments, a dielectric structure 306 is over the substrate 302 and one or more conductive interconnects 308 (e.g., conductive lines, conductive vias, bond pads, contacts, or the like) are disposed within the dielectric structure 306. The memory devices 101a, 101b 101c, 101d are over the dielectric structure 306 and the conductive interconnects 308. In some embodiments, one or more of the memory devices 101a, 101b 101c, 101d are coupled to one or more of the transistor devices 304 by one or more of the conductive interconnects 308. In some embodiments, the memory devices 101a, 101b, 101c, 101d are laterally spaced apart from one another by dielectric layer 110 (e.g., as illustrated in FIG. 3) or a dielectric layer 402 (e.g., as illustrated in FIG. 4). In some embodiments (e.g., as illustrated in FIG. 3), the gate layer segments of the memory devices 101a, 101b, 101c, 101d are laterally separated and electrically isolated from one another so that the memory devices can be separately programmed. In some embodiments (e.g., as illustrated in FIG. 4), dielectric layer 202 continuously extends along each of the memory devices 101a, 101b, 101c, 101d.

In some embodiments, the memory devices 101a, 101b 101c, 101d are programmed with different values. For example, in some embodiments, the first memory device 101a is programmed to store a first value (e.g., 00) by applying a first program voltage (e.g., 0 volts) to the first gate layer segment 102a. A first number of charge carriers 116a are trapped in the first charge traps 112a along the first interface 114a after the first program voltage is applied to the first gate layer segment 102a. In some embodiments where the first program voltage is 0 volts, the first number of charge carriers 116a trapped in the first charge traps 112a along the first interface 114a after the first program voltage is applied to the first gate layer segment 102a is approximately equal to the initial number of charge carriers that were trapped in the first charge traps 112a along the first interface 114a before the first program voltage was applied to the first gate layer segment 102a. The threshold voltage of the first memory device 101a is equal to a first threshold voltage $V_{T1}$ (e.g., corresponding to a first I-V curve 502a) after the first program voltage is applied to the first gate layer segment 102a. The first threshold voltage $V_{T1}$ corresponds to the first number of trapped charge carriers 116a. In some embodiments where the first program voltage is 0 volts, the first threshold voltage $V_{T1}$ is approximately equal to the initial threshold voltage of the first memory device 101a before the first program voltage was applied to the first gate layer segment 102a.

In some embodiments, the second memory device is programmed to store a second value (e.g., 01) by applying a second program voltage (e.g., 1 volt) to the second gate layer segment 102b. Applying the second program voltage to the second gate layer segment 102b causes a second number of charge carriers 116b, greater than the first number of charge carriers 116a, to be trapped in the second charge traps 112b along the second interface 114b. As a result, the threshold voltage of the second memory device 101b is equal to a second threshold voltage $V_{T2}$ (e.g., corresponding to a second I-V curve 502b), which may be referred to as a first shifted threshold voltage. For example, the threshold voltage of the second memory device 101b is shifted (e.g., as illustrated by arrow 504a) from the first threshold voltage $V_{T1}$ (e.g., the initial threshold voltage of the second memory device 101b) to the second threshold voltage $V_{T2}$. The second threshold voltage $V_{T2}$ corresponds to the second number of trapped charge carriers 116b.

In some embodiments, the third memory device is programmed to store a third value (e.g., 10) by applying a third program voltage (e.g., 1.5 volts) to the third gate layer segment 102c. Applying the third program voltage to the third gate layer segment 102c causes a third number of charge carriers 116c, greater than the second number of charge carriers 116b, to be trapped in the third charge traps 112c along the third interface 114c. As a result, the threshold voltage of the third memory device 101c is equal to a third threshold voltage $V_{T3}$ (e.g., corresponding to a third I-V curve 502c), which may be referred to as a second shifted threshold voltage. For example, the threshold voltage of the third memory device 101c is shifted (e.g., as illustrated by arrow 504b) from the first threshold voltage $V_{T1}$ (e.g., the initial threshold voltage of the third memory device 101c) to the third threshold voltage $V_{T3}$. The third threshold voltage $V_{T3}$ corresponds to the third number of trapped charge carriers 116c.

In some embodiments, the fourth memory device 101d is programmed to store a fourth value (e.g., 11) by applying a fourth program voltage (e.g., 2 volts) to the fourth gate layer segment 102d. Applying the fourth program voltage to the fourth gate layer segment 102d causes a fourth number of charge carriers 116d, greater than the third number of charge carriers 116c, to be trapped in the fourth charge traps 112d along the fourth interface 114d. As a result, the threshold voltage of the fourth memory device 101d is equal to a fourth threshold voltage $V_{T4}$ (e.g., corresponding to a fourth I-V curve 502d), which may be referred to as a third shifted threshold voltage. For example, the threshold voltage of the fourth memory device is shifted (e.g., as illustrated by arrow 504c) from the first threshold voltage $V_{T1}$ (e.g., the initial threshold voltage of the fourth memory device 101d) to the fourth threshold voltage $V_{T4}$. The fourth threshold voltage $V_{T4}$ corresponds to the fourth number of trapped charge carriers 116d.

In some embodiments, a single memory device (e.g., the first memory device 101a) can be programmed more than once when the subsequent programming includes applying a higher magnitude program voltage than that which was previously applied so that the threshold voltage of the memory device is further reduced. For example, in some embodiments, a memory device can be programmed a first time to a first value (e.g., 00) by applying a first program voltage (e.g., 0V) to the gate layer of the memory device to set the threshold voltage of the memory device to a first threshold voltage $V_{T1}$ (e.g., the initial threshold voltage of the memory device). By applying a program voltage of zero volts to the gate layer of the memory device, the threshold voltage of the memory device can "set to" (e.g., kept at) the initial threshold voltage. The memory device can be subsequently programmed a second time to a second value (e.g., 01) by applying a second program voltage (e.g., 1 volt) to the gate layer of the memory device to shift the threshold voltage of the memory device from the first threshold voltage $V_{T1}$ to a second threshold voltage $V_{T2}$ (e.g., as illustrated by arrow 506a). The memory device can be subsequently programmed a third time to a third value (e.g., 10) by applying a third program voltage (e.g., 1.5 volts) to the gate layer of the memory device to shift the threshold voltage of the memory device from the second threshold voltage $V_{T2}$ to a third threshold voltage $V_{T3}$ (e.g., as illustrated by arrow 506b). The memory device can be subsequently programmed a fourth time to a fourth value (e.g., 11) by applying a fourth program voltage (e.g., 2 volts) to the gate layer of the memory device to shift the threshold voltage of the memory device from the third threshold voltage $V_{T3}$ to a fourth threshold voltage $V_{T4}$ (e.g., as illustrated by arrow 506c).

In some embodiments, the differences between the threshold voltages are approximately equal. For example, in some embodiments, a difference between the first threshold voltage $V_{T1}$ and the second threshold voltage $V_{T2}$ is approximately equal to a difference between the second threshold voltage $V_{T2}$ and the third threshold voltage $V_{T3}$ and approximately equal to a difference between the third threshold voltage $V_{T3}$ and the fourth threshold voltage $V_{T4}$. In some other embodiments, the differences between the threshold voltages are not equal. For example, in some embodiments, the difference between the first threshold voltage $V_{T1}$ and the second threshold voltage $V_{T2}$ is greater than the difference between the second threshold voltage $V_{T2}$ and the third threshold voltage $V_{T3}$, and the difference between the second threshold voltage $V_{T2}$ and the third threshold voltage $V_{T3}$ is greater than the difference between the third threshold voltage $V_{T3}$ and the fourth threshold voltage $V_{T4}$.

Figure 6:
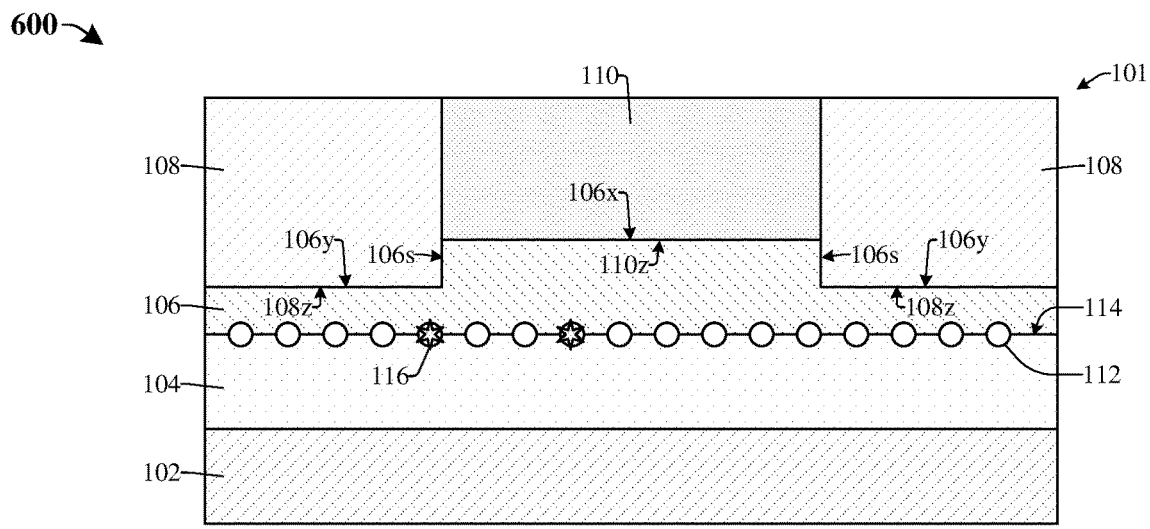
FIG. 6 illustrates a cross-sectional view of some other embodiments of the memory device of FIG. 1A.

FIG. 6 illustrates a cross-sectional view 600 of some embodiments of the memory device 101 of FIG. 1A in which a top surface 106x of the channel layer 106 is recessed directly below the source/drain electrodes 108.

Bottom surfaces 108z of the source/drain electrodes 108 are below the top surface 106x of the channel layer 106. The source/drain electrodes 108 extend along upper surfaces 106y and sidewalls 106s of the channel layer 106. The bottom surfaces 108z of the source/drain electrodes 108 are below a bottom surface 110z of dielectric layer 110. The memory device 101 may have this structure due to a source/drain opening etch (e.g., illustrated in FIG. 15) extending into the channel layer 106.

Figure 7:
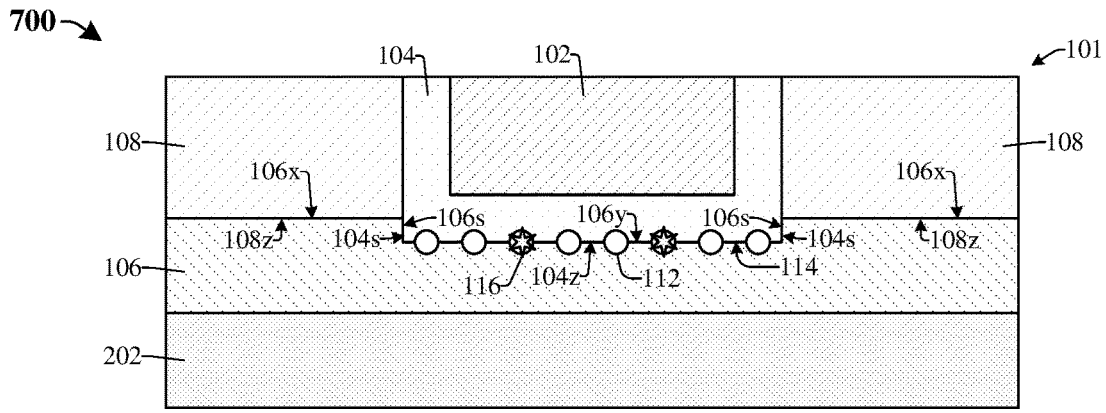
FIG. 7 illustrates a cross-sectional view of some other embodiments of the memory device of FIG. 2.

FIG. 7 illustrates a cross-sectional view 700 of some embodiments of the memory device 101 of FIG. 2 in which a top surface 106x of the channel layer 106 is recessed between the source/drain electrodes 108.

In some embodiments, a bottom surface 104z of the ferroelectric layer 104 is below the top surface 106x of the channel layer 106 between the source/drain electrodes 108. The ferroelectric layer 104 extends along sidewalls 106s and an upper surface 106y of the channel layer 106. The bottom surface 104z of the ferroelectric layer 104 is below bottom surfaces 108z of the source/drain electrodes 108. The memory device 101 may have this structure due to a trench etch (e.g., illustrated in FIG. 25) extending into the channel layer 106.

In some embodiments, the interface 114 between the ferroelectric layer 104 and the channel layer 106 extends vertically along the sidewalls 106s of the channel layer 106 and sidewalls 104s of the ferroelectric layer 104. Thus, in some embodiments, charge traps 112 are along the interface between the sidewalls 104s of the ferroelectric layer 104 and the sidewalls 106s of the channel layer 106. Further, one or more charge carriers 116 may be trapped in the charge traps 112 along the interface at the sidewalls 104s of the ferroelectric layer 104 and the sidewalls 106s of the channel layer 106.

FIGS. 8-17 illustrate cross-sectional views 800-1700 of some embodiments of a method for forming an integrated chip comprising a plurality of memory devices 101a, 101b, 101c, 101d over a substrate 302. Although FIGS. 8-17 are described in relation to a method, it will be appreciated that the structures disclosed in FIGS. 8-17 are not limited to such a method, but instead may stand alone as structures independent of the method.

Figure 8:
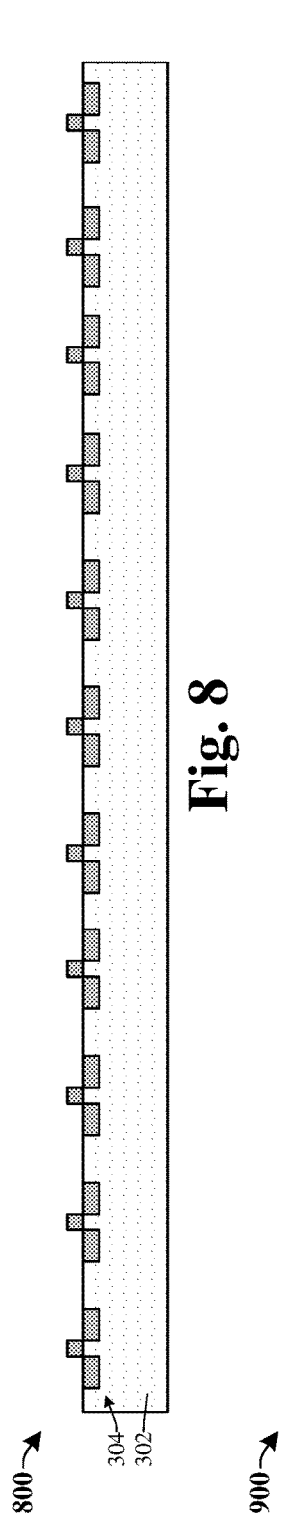
FIGS. 8-17 illustrate cross-sectional views of some embodiments of a method for forming an integrated chip comprising a plurality of memory devices over a substrate.

As shown in cross-sectional view 800 of FIG. 8, a plurality of transistor devices 304 are formed along a substrate 302. In some embodiments, the substrate 302 comprises silicon or some other suitable material. In some embodiments, the transistor devices 304 may, for example, be or comprise metal oxide semiconductor field effect transistors (MOSFETs), fin field effect transistors (Fin FETs), gate all-around field effect transistors (GAA FETs), or some other suitable devices.

Figure 9:
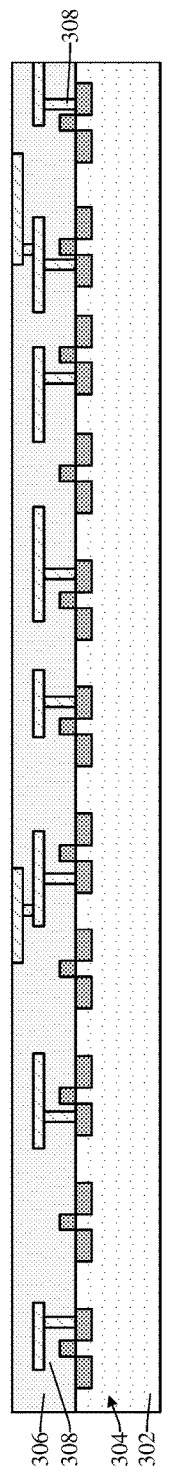

As shown in cross-sectional view 900 of FIG. 9, a dielectric structure 306 and a plurality of conductive interconnects 308 are formed over the substrate 302. In some embodiments, the dielectric structure 306 comprises one or more dielectric layers. In some embodiments, the conductive interconnects 308 may, for example, comprise contacts, metal lines, metal vias, bond pads, or the like.

Figure 10:
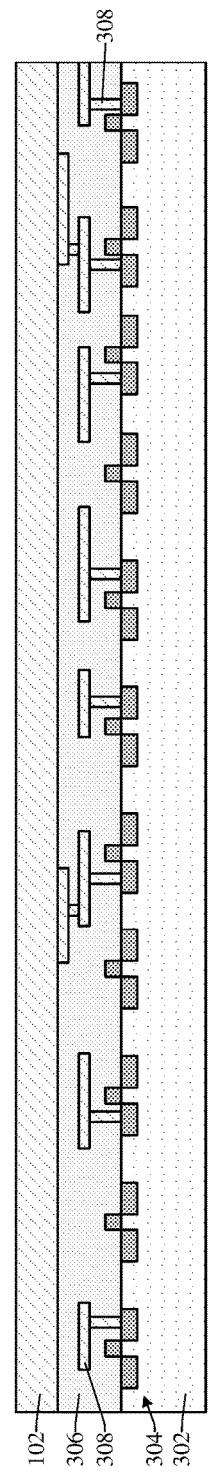

As shown in cross-sectional view 1000 of FIG. 10, a gate layer 102 is deposited over the substrate 302. In some embodiments, the gate layer 102 comprises tungsten, copper, aluminum, or some other suitable material. In some embodiments, the gate layer 102 is deposited by a chemical vapor deposition (CVD) process, a physical vapor deposition (PVD) process, an atomic layer deposition (ALD) process, or some other suitable process.

Figure 11:
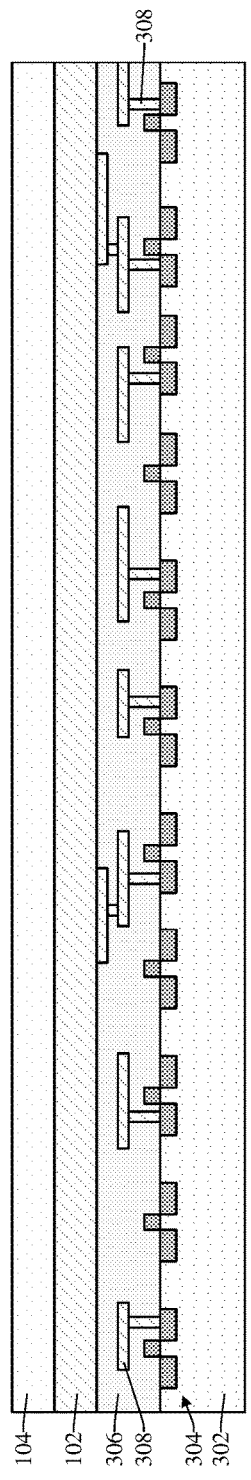

As shown in cross-sectional view 1100 of FIG. 11, a ferroelectric layer 104 is deposited over the gate layer 102. In some embodiments, the ferroelectric layer 104 comprises hafnium zirconium oxide (e.g., HZO) or some other suitable material. In some embodiments, the ferroelectric layer 104 is deposited by a CVD process, a PVD process, an ALD process, or some other suitable process.

Figure 12:
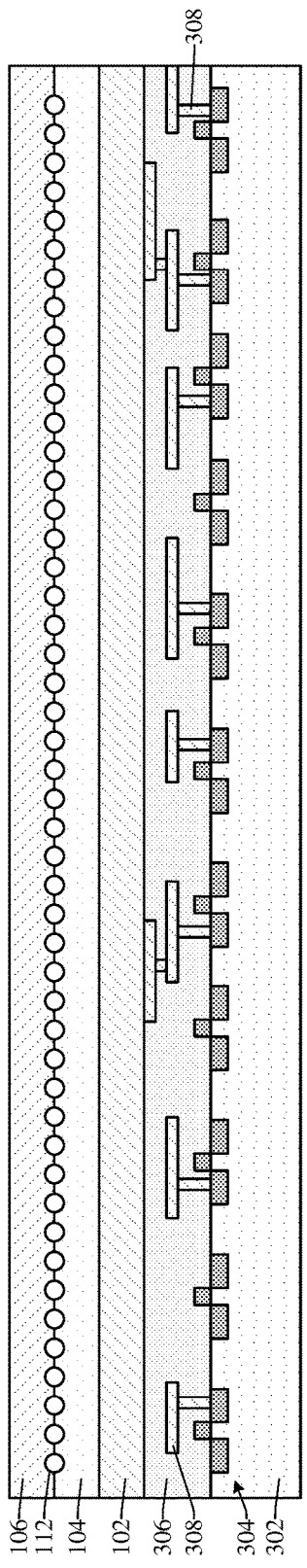

As shown in cross-sectional view 1200 of FIG. 12, a channel layer 106 is deposited over the ferroelectric layer 104. A plurality of charge traps 112 are along an interface 114 between the channel layer 106 and the ferroelectric layer 104 after the channel layer 106 is deposited over the ferroelectric layer 104. In some embodiments, the channel layer 106 comprises a metal oxide semiconductor such as, for example, indium gallium zinc oxide, zinc oxide, tin oxide, indium tin oxide, nickel oxide, or some other suitable material. In some embodiments, the channel layer 106 is deposited by a CVD process, a PVD process, an ALD process, or some other suitable process.

Figure 13:
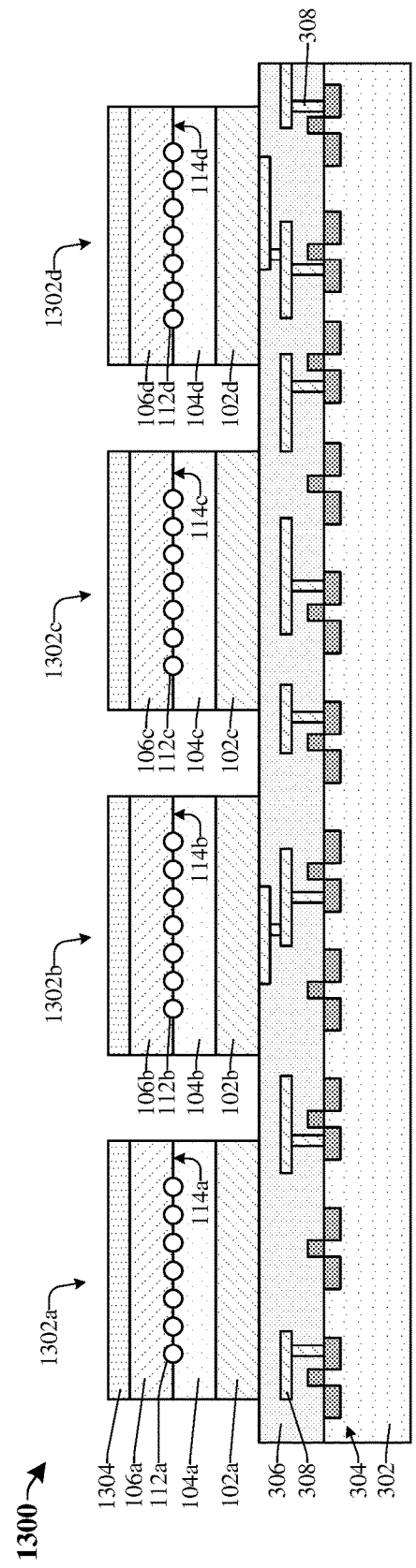

As shown in cross-sectional view 1300 of FIG. 13, the channel layer 106, the ferroelectric layer 104, and the gate layer 102 are etched. The etching forms channel layer segments 106a, 106b, 106c, 106d from the channel layer 106, ferroelectric layer segments 104a, 104b, 104c, 104d from the ferroelectric layer 104, and gate layer segments 102a, 102b, 102c, 102d from the gate layer 102. For example, a first channel layer segment 106a is formed from the channel layer 106, a first ferroelectric layer segment 104a is formed from the ferroelectric layer 104, and a first gate layer segment 102a is formed from the gate layer 102. The segments form segment stacks 1302a, 1302b, 1302c, 1302d. For example, the first gate layer segment 102a, the first ferroelectric layer segment 104a, and the first channel layer segment 106a form a first segment stack 1302a. The segment stacks 1302a, 1302b, 1302c, 1302d are laterally spaced apart over the substrate 302.

In some embodiments, a masking layer 1304 is formed over the channel layer 106 and the etching is performed according to the masking layer 1304. In some embodiments, the etching comprises a dry etching process (e.g., a plasma etching process, a reactive ion etching process, an ion beam etching process, or the like) or some other suitable etching process. In some embodiments, the masking layer 1304 comprises a photoresist mask, a hard mask, or the like. In some embodiments, the masking layer 1304 is removed during and/or after the etching.

Figure 14:
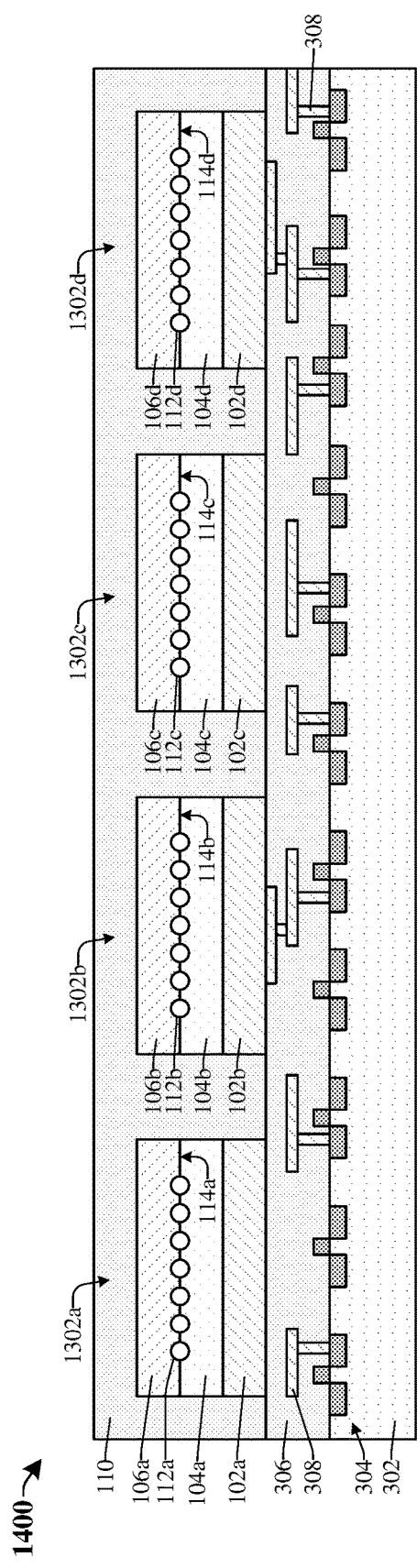

As shown in cross-sectional view 1400 of FIG. 14, a dielectric layer 110 is deposited over and between the segment stacks 1302a, 1302b, 1302c, 1302d. In some embodiments, dielectric layer 110 comprises silicon dioxide or some other suitable material. In some embodiments, dielectric layer 110 is deposited by a CVD process, a PVD process, an ALD process, or some other suitable process.

Figure 15:
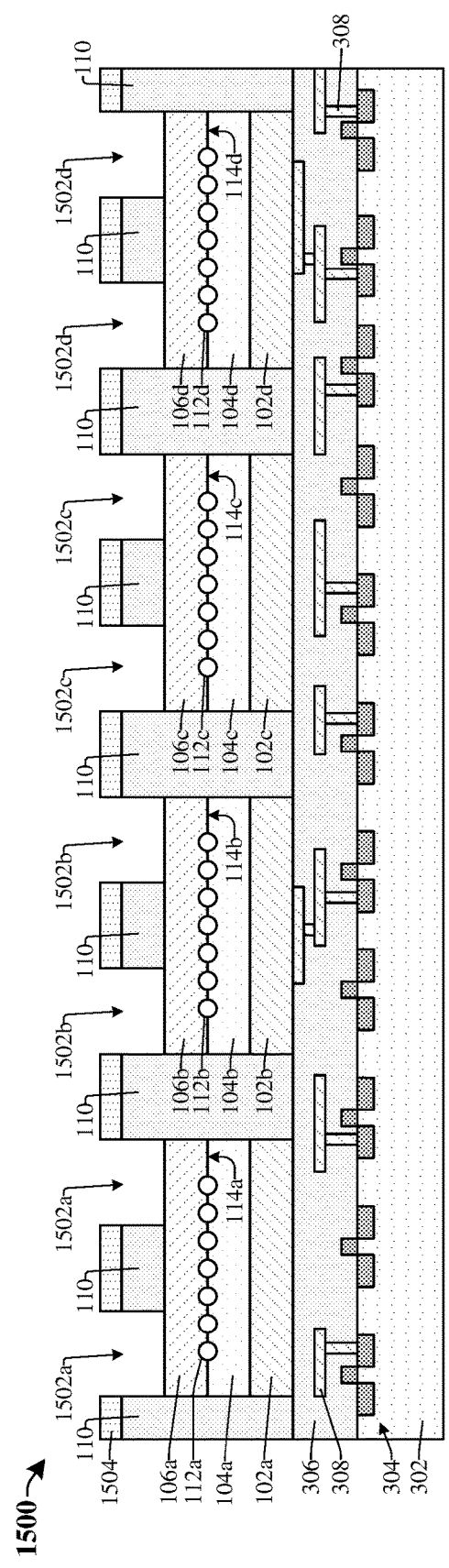

As shown in cross-sectional view 1500 of FIG. 15, dielectric layer 110 is etched. The etching forms pairs of source/drain openings 1502a, 1502b, 1502c, 1502d over the segment stacks 1302a, 1302b, 1302c, 1302d, respectively. For example, a first pair of source/drain openings 1502a are formed over the first channel layer segment 106a. The first pair of source/drain openings 1502a are laterally spaced apart from one another by dielectric layer 110.

In some embodiments, a masking layer 1504 is formed over dielectric layer 110 and the etching is performed according to the masking layer 1504. In some embodiments, the etching comprises a dry etching process or some other suitable etching process. In some embodiments, the masking layer 1504 comprises a photoresist mask, a hard mask, or the like. In some embodiments, the masking layer 1504 is removed during and/or after the etching.

In some embodiments, the etching extends into one or more of the channel layer segments 106a, 106b, 106c, 106d, thereby recessing top surfaces the one or more channel layer segments at the respective source/drain openings. For example, the etching extends into the first channel layer segment 106a, thereby recessing the top surface of the first channel layer segment 106a at the first pair of source/drain openings 1502a. Thus, when a first pair of source/drain electrodes (e.g., 108a of FIG. 16) are subsequently formed in the first pair of source/drain openings 1502a (e.g., as illustrated in FIG. 16), bottom surfaces of the first pair of source/drain electrodes will be below the top surfaces of the first channel layer segment 106a (e.g., as illustrated in FIG. 6).

Figure 16:
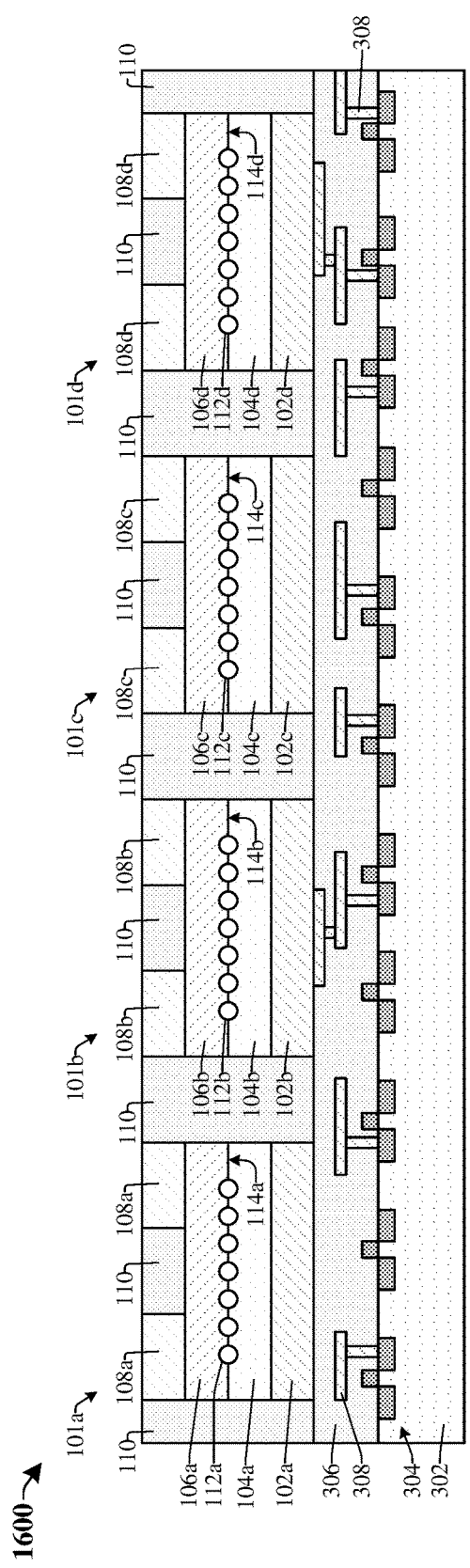

As shown in cross-sectional view 1600 of FIG. 16, pairs of source/drain electrodes 108a, 108b, 108c, 108d in the pairs of source/drain openings 1502a, 1502b, 1502c, 1502d, respectively. For example, a first pair of source/drain electrodes 108a (e.g., a first source/drain electrode and a second source/drain electrode) are formed in the first pair of source/drain openings 1502a.

In some embodiments, the source/drain electrodes 108a, 108b, 108c, 108d are formed by depositing (e.g., by a CVD process, a PVD process, an ALD process, or some other suitable process) a conductive layer (e.g., a layer comprising tungsten, aluminum, titanium, or some other suitable material) and by subsequently performing a planarization process (e.g., a chemical mechanical planarization (CMP) or some other suitable process) on the conductive layer.

The gate layer segments 102a, 102b, 102c, 102d, the ferroelectric layer segments 104a, 104b, 104c, 104d, the channel layer segments 106a, 106b, 106c, 106d, and the pairs of source/drain electrodes 108a, 108b, 108c, 108d form respective memory devices 101a, 101b 101c, 101d having respective interfaces 114a, 114b, 114c, 114d and respective charge traps 112a, 112b, 112c, 112d along the respective interfaces. For example, the first gate layer segment 102a, the first ferroelectric layer segment 104a, the first channel layer segment 106a, and the first pair of source/drain electrodes 108a form a first memory device 101a having a first interface 114a between the first ferroelectric layer segment 104a and the first channel layer segment 106a. First charge traps 112a are along the first interface 114a.

Figure 17:
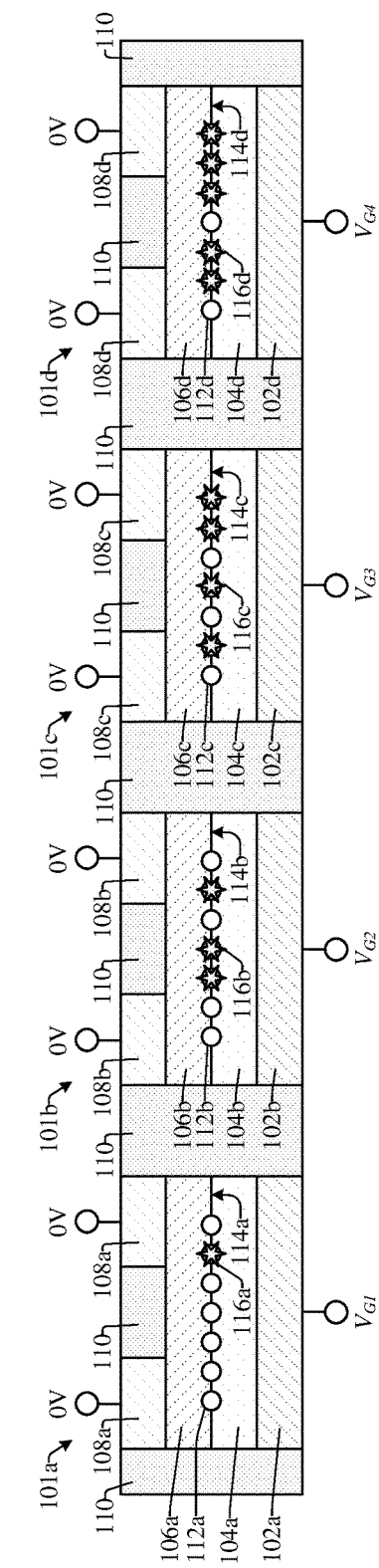

As shown in cross-sectional view 1700 of FIG. 17, the memory devices 101a, 101b, 101c, 101d are programmed. As discussed with regard to FIGS. 3 and 4, the memory devices 101a, 101b, 101c, 101d can be programmed by applying program voltages to the gate layer segments 102a, 102b, 102c, 102d of the memory devices 101a, 101b, 101c, 101d to trap the charge carriers 116a, 116b, 116c, 116d in the charge traps 112a, 112b, 112c, 112d along the interfaces 114a, 114b, 114c, 114d, thereby adjusting the threshold voltages of the memory devices 101a, 101b, 101c, 101d.

In some embodiments, some memory devices are programmed to store different values than other memory devices. For example, in some embodiments, a first program voltage $V_{G1}$ (e.g., 0 volts) is applied to the first gate layer segment 102a, a second program voltage $V_{G2}$ (e.g., 1 volt) is applied to the second gate layer segment 102b, a third program voltage $V_{G3}$ (e.g., 1.5 volts) is applied to the third gate layer segment 102c, and a fourth program voltage $V_{G4}$ (e.g., 2 volts) is applied to the fourth gate layer segment 102d. Thus, the memory devices 101a, 101b, 101c, 101d have different numbers of electrons trapped along their interfaces 114a, 114b, 114c, 114d corresponding to different threshold voltages.

In some embodiments, multiple memory devices are be programmed to store a same value. For example, by applying a same program voltage to the gate layer segments of multiple memory devices, the memory devices can be programmed to store the same value.

In some embodiments, the program voltages are positive voltages. Thus, negative charge carriers (e.g., electrons) are attracted to the gate layer segments and become trapped in the charge traps along the interfaces. As a result, the threshold voltages are shifted in the negative direction (e.g., toward 0 volts). Thus, the currents through the memory devices can be increased and hence the speeds (e.g., write speeds, read speeds, or the like) of the memory devices can be increased. Thus, by applying positive voltages to the gate layer segments to program the memory devices, the performance of the memory devices can be improved.

In some embodiments, the program voltage is applied in a pulse. For example, a program voltage is applied to a gate layer segment (e.g., 102a) of a memory device (e.g., 101a) for a period of time and is subsequently removed from the gate layer segment.

In some embodiments, the charge carriers (e.g., 116a) trapped along an interface (e.g., 114a) of a memory device (e.g., 101a) will remain trapped in the charge traps (e.g., 112a) along the interface after program voltage is removed from the gate layer of the memory device. Accordingly, in some embodiments, after the program voltage is removed from the gate layer segment of the memory device being programmed, the threshold voltage of that memory device remains different from its previous threshold voltage. For example, in some embodiments, the second memory device 101b is programmed to store a second value by applying a second program voltage $V_{G2}$ to the second gate layer segment 102b. As a result, the threshold voltage of the second memory device 101b shifts from the first (e.g., initial) threshold voltage to the second threshold voltage. The threshold voltage of the second memory device 101b will remain at the second threshold voltage even after the second program voltage $V_{G2}$ is removed from the second gate layer segment 102b. In some embodiments, the threshold voltage of the second memory device 101b may shift slightly from the second threshold voltage $V_{G2}$ over time, but a likelihood of the threshold voltage returning to the first threshold voltage is very low. In other words, the threshold voltage of the second memory device 101b will remain at the different threshold voltage than the first threshold voltage even after the second program voltage $V_{G2}$ is removed from the second gate layer segment 102b. Thus, the programming may be referred to as "permanent".

In some embodiments, a plurality of memory devices of the integrated chip are programmed to store the first value. For example, a plurality of memory devices are programmed with a zero volt program voltage. In other words, the memory devices are kept in their initial state. As a result, the memory devices can be programmed at a later time.

As discussed with regard to FIG. 3 and FIG. 4, a memory devices can be read (e.g., the value programmed in the memory device can be determined) by determining the threshold voltages of the memory device. For example, in some embodiments, the threshold voltage of a memory device can be determined by applying a plurality of read voltages to the gate layer segment of the memory device and determining at which voltages of the read voltages the memory device turns on (e.g., conducts substantial current between the source/drain electrodes).

Further, as discussed with regard to FIG. 3 and FIG. 4, in some embodiments, a single memory device can be programmed multiple times if the program voltage during the secondary programming is greater than the program voltage during the initial primary programming.

The substrate 302, transistor devices 304, dielectric structure 306, and conductive interconnects 308 are not shown in FIG. 17 for simplicity and clarity of illustration.

FIGS. 18-29 illustrate cross-sectional views 1800-2900 of some other embodiments of a method for forming an integrated chip comprising a plurality of memory devices 101a, 101b, 101c, 101d over a substrate 302. Although FIGS. 18-29 are described in relation to a method, it will be appreciated that the structures disclosed in FIGS. 18-29 are not limited to such a method, but instead may stand alone as structures independent of the method.

Figure 18:
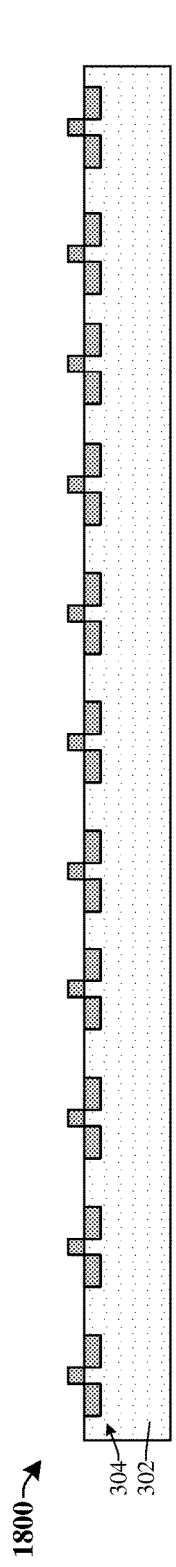

As shown in cross-sectional view 1800 of FIG. 18, a plurality of transistor devices 304 are formed along a substrate 302 (e.g., as described with regard to FIG. 8).

Figure 19:
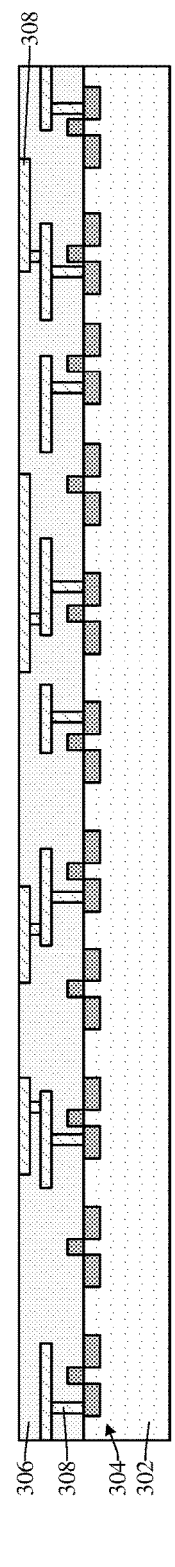

As shown in cross-sectional view 1900 of FIG. 19, a dielectric structure 306 and a plurality of conductive interconnects 308 are formed over the substrate 302 (e.g., as described with regard to FIG. 9).

Figure 20:
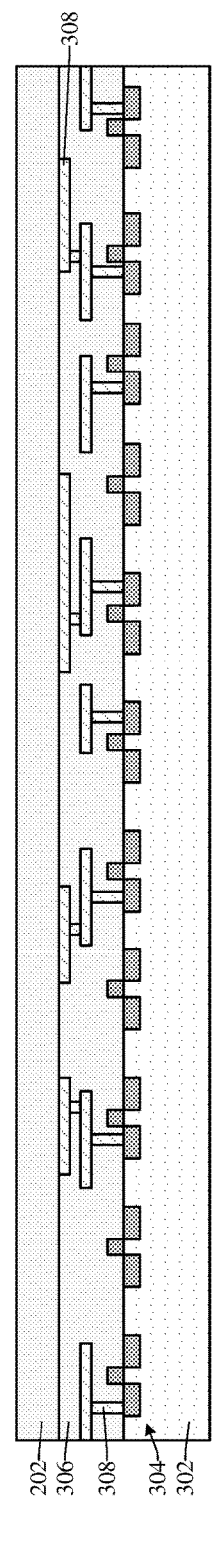

As shown in cross-sectional view 2000 of FIG. 20, a dielectric layer 202 is deposited over the substrate 302. In some embodiments, dielectric layer 202 comprises silicon dioxide or some other suitable material. In some embodiments, dielectric layer 202 is deposited by a CVD process, a PVD process, an ALD process, or some other suitable process.

Figure 21:
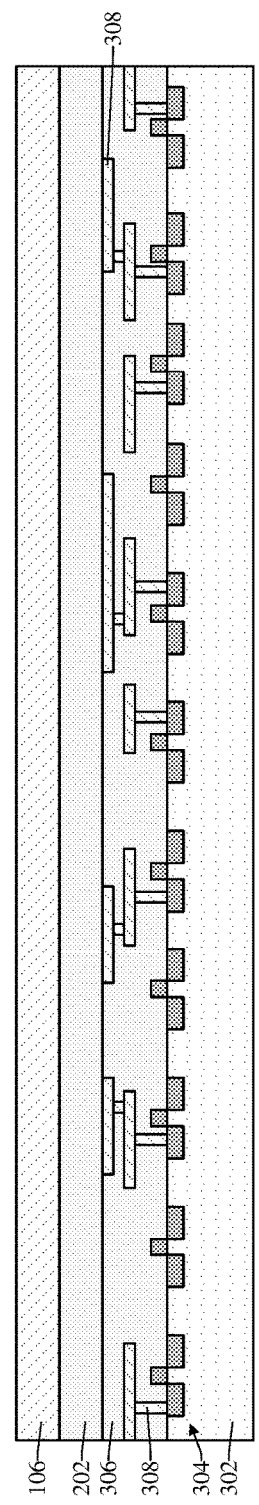

As shown in cross-sectional view 2100 of FIG. 21, a channel layer 106 is deposited over dielectric layer 202. In some embodiments, the channel layer 106 comprises a metal oxide semiconductor or some other suitable material. In some embodiments, the channel layer 106 is deposited by a CVD process, a PVD process, an ALD process, or some other suitable process.

Figure 22:
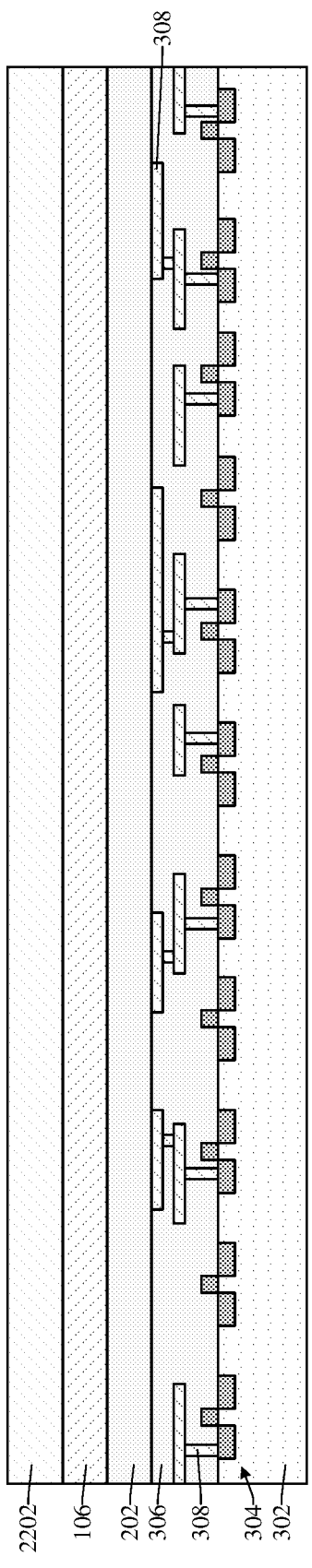

As shown in cross-sectional view 2200 of FIG. 22, a source/drain layer 2202 is deposited over the channel layer 106. In some embodiments, the source/drain layer 2202 comprises tungsten, aluminum, titanium, or some other suitable material. In some embodiments, the source/drain layer 2202 is deposited by a CVD process, a PVD process, an ALD process, or some other suitable process.

Figure 23:
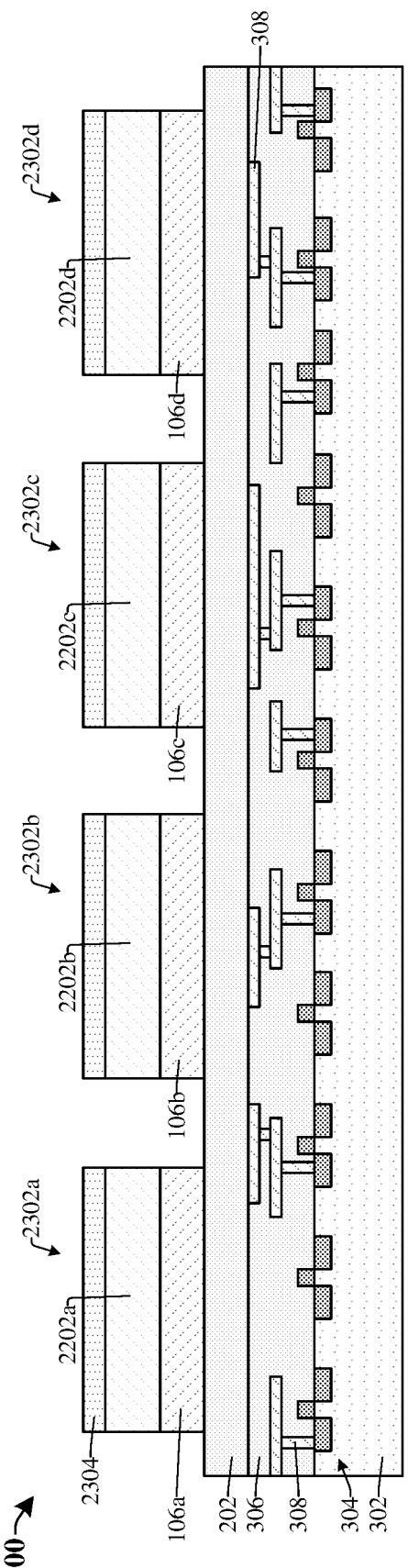

As shown in cross-sectional view 2300 of FIG. 23, the source/drain layer 2202 is etched. The etching forms source/drain layer segments 2202a, 2202b, 2202c, 2202d from the source/drain layer 2202. Further, the channel layer 106 is etched to form channel layer segments 106a, 106b, 106c, 106d from the channel layer 106. For example, a first source/drain layer segment 2202a is formed from the source/drain layer 2202. Further, a first channel layer segment 106a is formed from the channel layer 106. The segments form segment stacks 2302a, 2302b, 2302c, 2302d. For example, the first channel layer segment 106a and the first source/drain layer segment 2202a form a first segment stack 2302a.

In some embodiments, a masking layer 2304 is formed over the source/drain layer 2202 and the etching is performed according to the masking layer 2304. In some embodiments, the etching comprises a dry etching process or some other suitable etching process. In some embodiments, the masking layer 2304 comprises a photoresist mask, a hard mask, or the like. In some embodiments, the masking layer 2304 is removed during and/or after the etching.

Although FIG. 22 and FIG. 23 illustrate the source/drain layer 2202 being deposited over the channel layer 106 before the channel layer 106 is etched, it will be appreciated that in some other embodiments, the channel layer 106 is etched before the source/drain layer 2202 is deposited. For example, in some embodiments, the channel layer 106 is etched to form channel layer segments 106a, 106b, 106c, 106d and the source/drain layer segments 2202a, 2202b, 2202c, 2202d are subsequently formed over the channel layer segments.

As shown in cross-sectional view 2400 of FIG. 24, a dielectric layer 402 is deposited over and between the segment stacks 2302a, 2302b, 2302c, 2302d. In some embodiments, dielectric layer 402 comprises silicon dioxide or some other suitable material. In some embodiments, dielectric layer 402 is deposited by a CVD process, a PVD process, an ALD process, or some other suitable process.

As shown in cross-sectional view 2500 of FIG. 25, dielectric layer 402 and the source/drain layer segments 2202a, 2202b, 2202c, 2202d are etched. The etching forms pairs of source/drain electrodes 108a, 108b, 108c, 108d over the channel layer segments 106a, 106b, 106c, 106d, respectively. For example, the first source/drain layer segment 2202a is etched to form a first pair of source/drain electrodes 108a over the first channel layer segment 106a.

The etching forms trenches 2502a, 2502b, 2502c, 2502d between the pairs of source/drain electrodes 108a, 108b, 108c, 108d, respectively. The trenches 2502a, 2502b, 2502c, 2502d are delimited by sidewalls of dielectric layer 402, sidewalls of the source/drain electrodes 108a, 108b, 108c, 108d, and top surfaces of the channel layer segments 106a, 106b, 106c, 106d. For example, a first trench 2502a is formed over the first channel layer segment 106a between the first pair of source/drain electrodes 108a. The first trench 2502a is delimited by sidewalls of dielectric layer 402, sidewalls of the first pair of source/drain electrodes 108a, and a top surface of the first channel layer segment 106a.

In some embodiments, a masking layer 2504 is formed over dielectric layer 402 and the etching is performed according to the masking layer 2504. In some embodiments, the etching comprises a dry etching process or some other suitable etching process. In some embodiments, the masking layer 2504 comprises a photoresist mask, a hard mask, or the like. In some embodiments, the masking layer 2504 is removed during and/or after the etching.

In some embodiments, the etching extends into one or more of the channel layer segments 106a, 106b, 106c, 106d, thereby recessing top surfaces of the one or more channel layer segments between the respective pair of source/drain electrodes. For example, the etching extends into the first channel layer segment 106a, thereby recessing a top surface of the first channel layer segment 106a between the first pair of source/drain electrodes 108a. Thus, when a ferroelectric layer (e.g., 104 of FIG. 26) is subsequently deposited over the first channel layer segment 106a and in the first trench 2502a (e.g., as illustrated in FIG. 26), a bottom surface of the ferroelectric layer will be below the top surfaces of the first channel layer segment 106a (e.g., as illustrated in FIG. 7).

Figure 26:
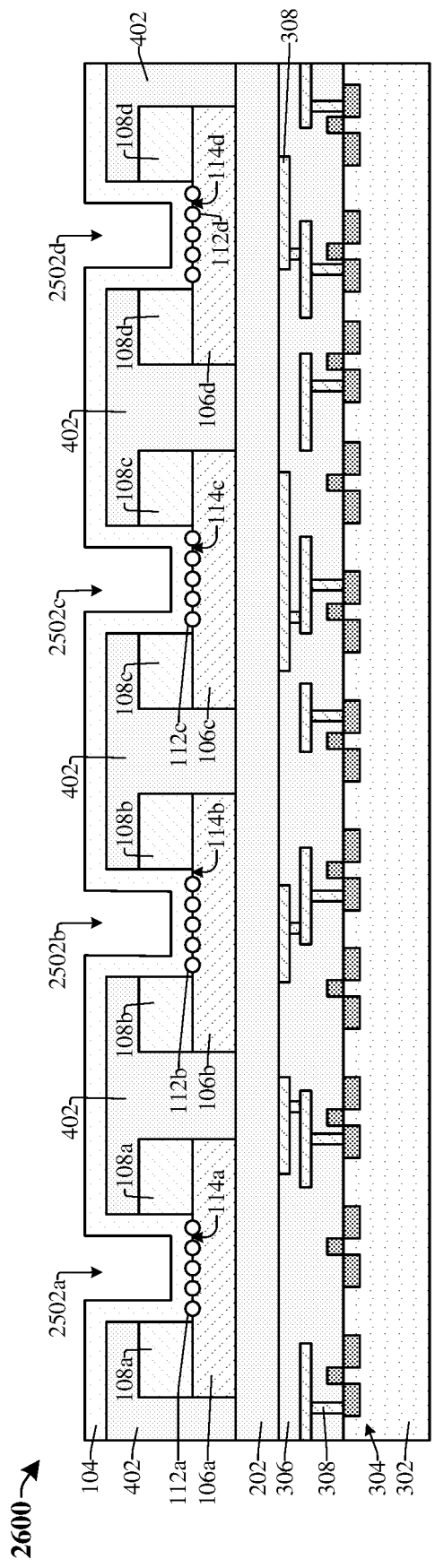

As shown in cross-sectional view 2600 of FIG. 26, a ferroelectric layer 104 is deposited over dielectric layer 402 and in the trenches 2502a, 2502b, 2502c, 2502d. The ferroelectric layer 104 lines the trenches 2502a, 2502b, 2502c, 2502d. For example, the ferroelectric layer 104 is deposited along the upper surface of the first channel layer segment 106a, along the sidewalls of the first pair of source/drain electrodes 108a, and along top surfaces of the first pair of source/drain electrodes 108a. In some embodiments, the ferroelectric layer 104 comprises HZO or some other suitable material. In some embodiments, the ferroelectric layer 104 is deposited by a CVD process, a PVD process, an ALD process, or some other suitable process.

Figure 27:
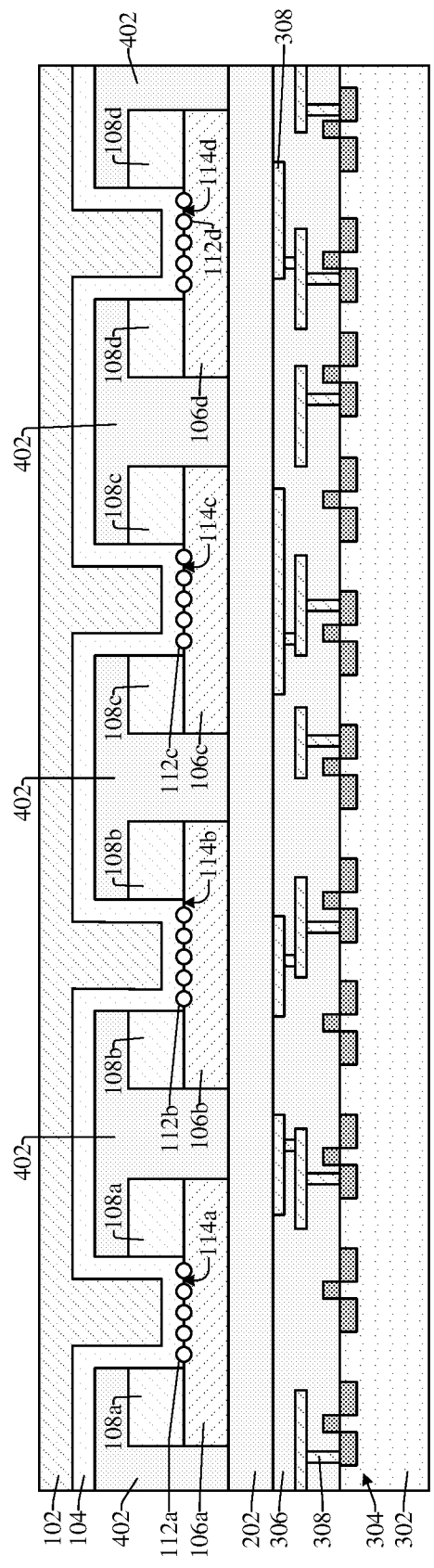

As shown in cross-sectional view 2700 of FIG. 27, a gate layer 102 is deposited over the ferroelectric layer 104 and in the trenches 2502a, 2502b, 2502c, 2502d. For example, the gate layer 102 is deposited over the ferroelectric layer 104 and between the sidewalls of the first pair of source/drain electrodes 108a. The gate layer 102 fills a remainder of the trenches 2502a, 2502b, 2502c, 2502d. In some embodiments, the gate layer 102 comprises tungsten, copper, aluminum, or some other suitable material. In some embodiments, the gate layer 102 is deposited by a CVD process, a PVD process, an ALD process, or some other suitable process.

Figure 28:
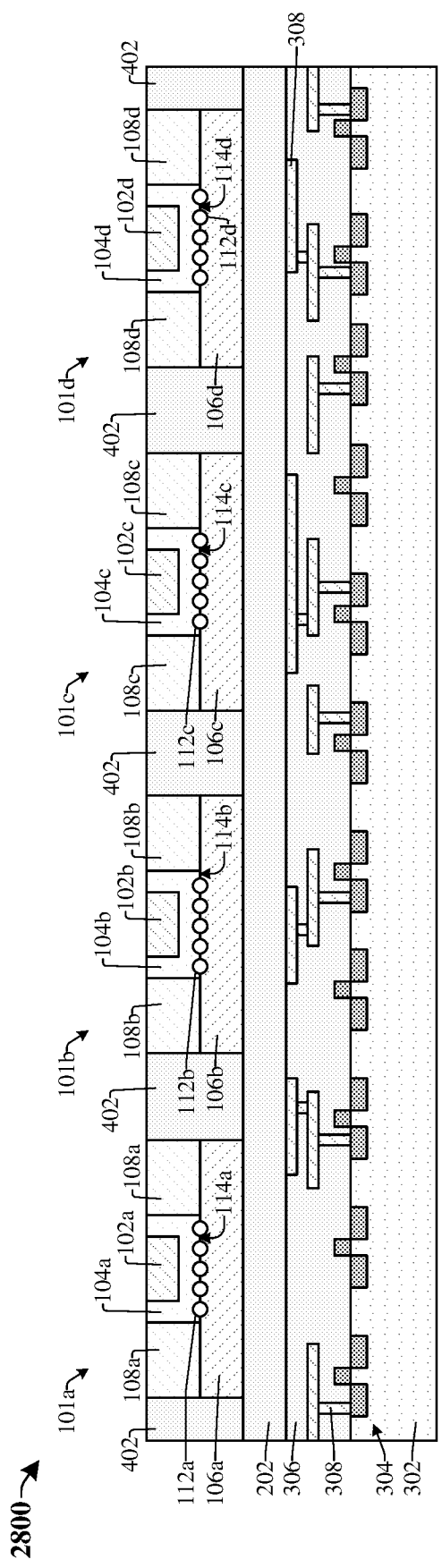

As shown in cross-sectional view 2800 of FIG. 28, a planarization process is performed on the gate layer 102 and the ferroelectric layer 104 to form ferroelectric layer segments 104a, 104b, 104c, 104d from the ferroelectric layer 104 and gate layer segments 102a, 102b, 102c, 102d from the gate layer 102. The planarization process removes the gate layer 102 and the ferroelectric layer 102 from over the source/drain electrodes 108a, 108b, 108c, 108d.

In some embodiments, top surfaces of dielectric layer 402, the source/drain electrodes 108a, 108b, 108c, 108d, the ferroelectric layer segments 104a, 104b, 104c, 104d, and the gate layer segments 102a, 102b, 102c, 102d are approximately coplanar as a result of the planarization process. In some embodiments, the planarization process is also performed on the source/drain electrodes 108a, 108b, 108c, 108d. In some embodiments, the planarization process comprises a CMP or some other suitable process.

The gate layer segments 102a, 102b, 102c, 102d, the ferroelectric layer segments 104a, 104b, 104c, 104d, the channel layer segments 106a, 106b, 106c, 106d, and the pairs of source/drain electrodes 108a, 108b, 108c, 108d form respective memory devices 101a, 101b, 101c, 101d having respective interfaces 114a, 114b, 114c, 114d and respective charge traps 112a, 112b, 112c, 112d along the respective interfaces 114a, 114b, 114c, 114d.

Figure 29:
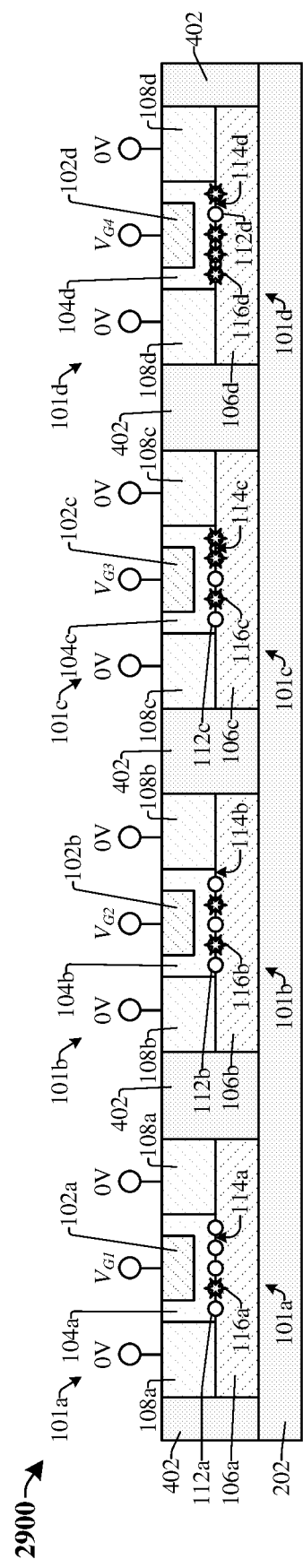

As shown in cross-sectional view 2900 of FIG. 29, the memory devices are programmed (e.g., as discussed with regard to FIG. 3, FIG. 4, and FIG. 17). The substrate 302, transistor devices 304, dielectric structure 306, and conductive interconnects 308 are not shown in FIG. 29 for simplicity and clarity of illustration.

Figure 30:
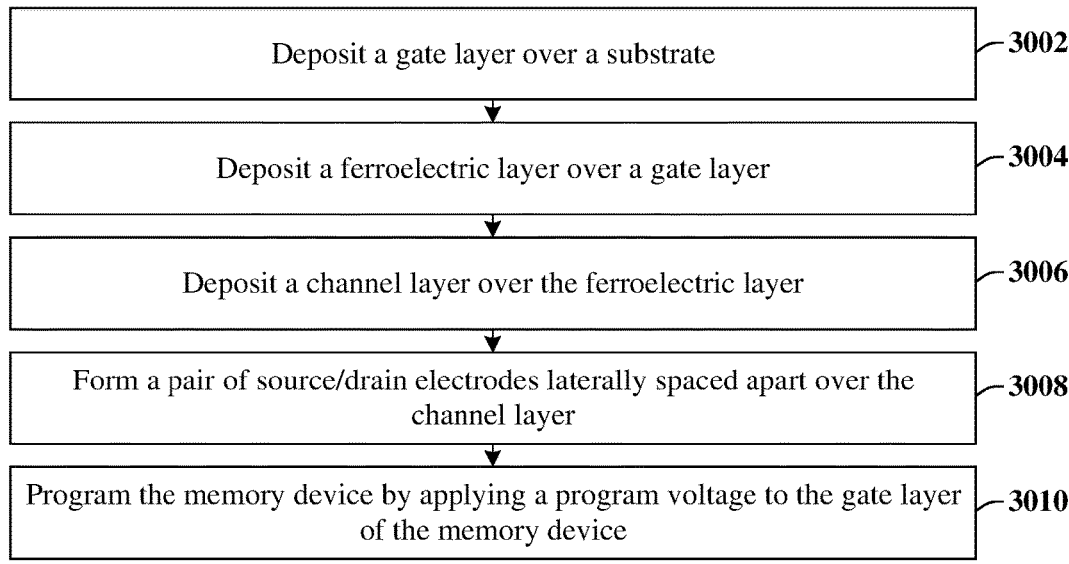
FIG. 30 illustrates a flow diagram of some embodiments of a method for forming a memory device comprising a plurality of charge traps along an interface between a ferroelectric layer and a channel layer.
Figure 31:
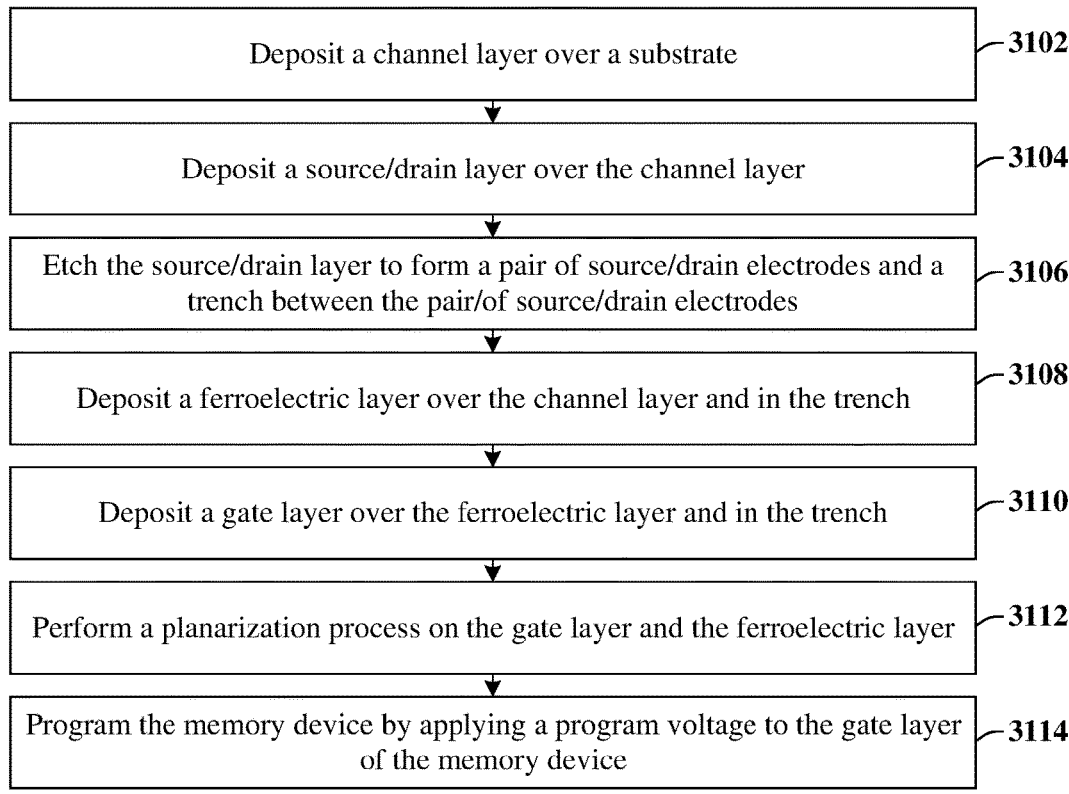
FIG. 31 illustrates a flow diagram of some other embodiments of a method for forming a memory device comprising a plurality of charge traps along an interface between a ferroelectric layer and a channel layer.
Figure 32:
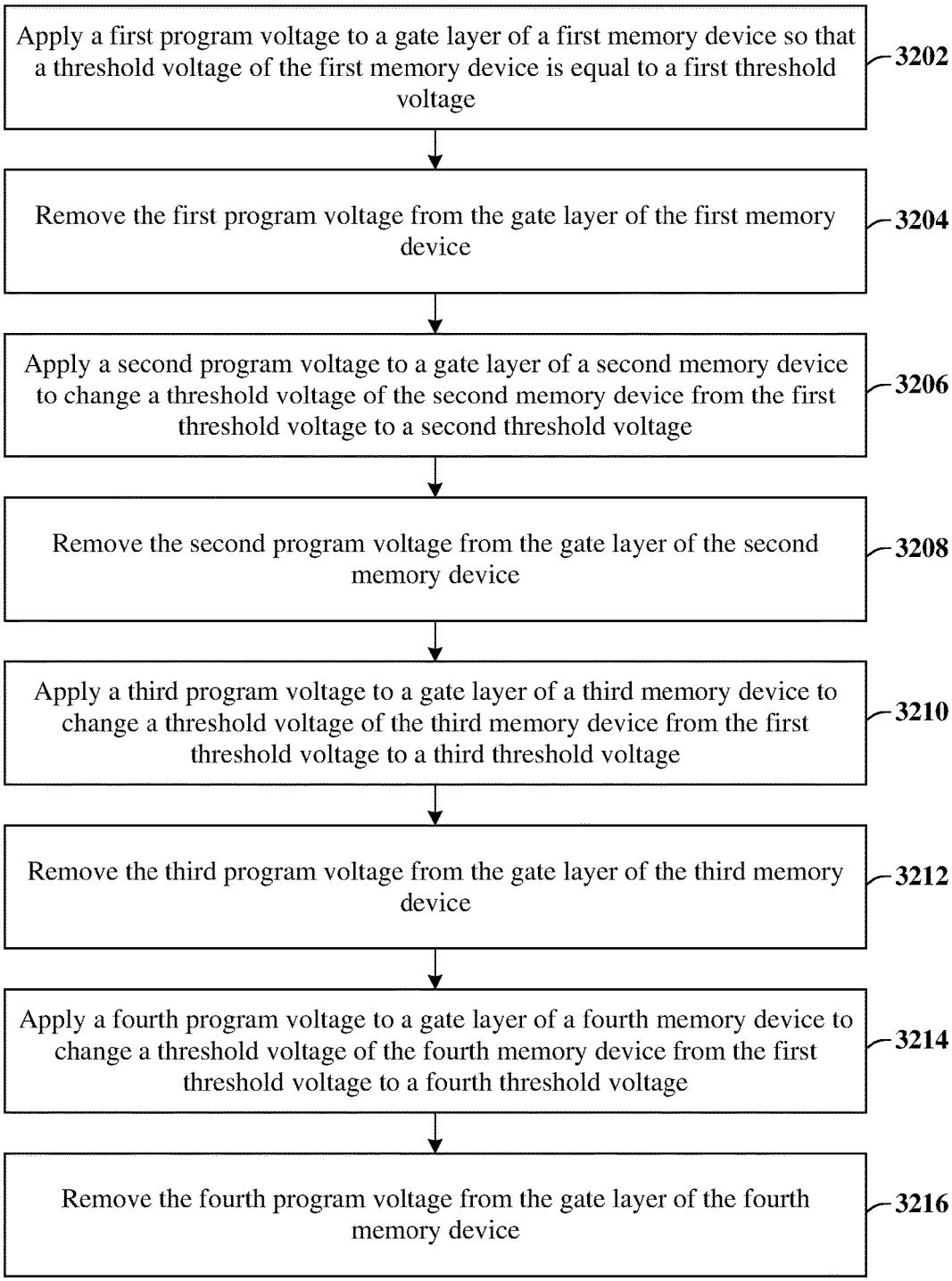
FIG. 32 illustrates a flow diagram of some embodiments of a method for programming a plurality of memory devices.

FIGS. 30, 31, 32 illustrate flow diagrams of some embodiments of methods 3000, 3100, 3200, respectively. While methods 3000, 3100, 3200 are illustrated and described below as series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 30 illustrates a flow diagram of some embodiments of a method 3000 for forming a memory device comprising a plurality of charge traps along an interface between a ferroelectric layer and a channel layer.

At block 3002, deposit a gate layer over a substrate. FIG. 10 illustrates a cross-sectional view 1000 of some embodiments corresponding to block 3002.

At block 3004, deposit a ferroelectric layer over a gate layer. FIG. 11 illustrates a cross-sectional view 1100 of some embodiments corresponding to block 3004.

At block 3006, deposit a channel layer over the ferroelectric layer. A plurality of charge traps are formed along an interface between the channel layer and the ferroelectric layer in response to depositing the channel layer over the ferroelectric layer. FIG. 12 illustrates a cross-sectional view 1200 of some embodiments corresponding to block 3006.

At block 3008, form a pair of source/drain electrodes laterally spaced apart over the channel layer. FIG. 16 illustrates a cross-sectional view 1600 of some embodiments corresponding to block 3008.

At block 3010, program the memory device by applying a program voltage to the gate layer of the memory device. Applying the program voltage to the gate layer sets a threshold voltage of the memory device which indicates the value stored by the first memory device. FIG. 17 illustrates a cross-sectional view 1700 of some embodiments corresponding to block 3010.

FIG. 31 illustrates a flow diagram of some embodiments of a method 3100 for forming a memory device comprising a plurality of charge traps along an interface between a ferroelectric layer and a channel layer.

At block 3102, deposit a channel layer over a substrate. FIG. 21 illustrates a cross-sectional view 2100 of some embodiments corresponding to block 3102.

At block 3104, deposit a source/drain layer over the channel layer. FIG. 22 illustrates a cross-sectional view 2200 of some embodiments corresponding to block 3104.

At block 3106, etch the source/drain layer to form a pair of source/drain electrodes and a trench between the pair/of source/drain electrodes. FIG. 25 illustrates a cross-sectional view 2500 of some embodiments corresponding to block 3106.

At block 3108, deposit a ferroelectric layer over the channel layer and in the trench. A plurality of charge traps are formed along an interface between the ferroelectric layer and the channel layer in response to depositing the ferroelectric layer over the channel layer. FIG. 26 illustrates a cross-sectional view 2600 of some embodiments corresponding to block 3108.

At block 3110, deposit a gate layer over the ferroelectric layer and in the trench. FIG. 27 illustrates a cross-sectional view 2700 of some embodiments corresponding to block 3110.

At block 3112, perform a planarization process on the gate layer and the ferroelectric layer. FIG. 28 illustrates a cross-sectional view 2800 of some embodiments corresponding to block 3112.

At block 3114, program the memory device by applying a program voltage to the gate layer of the memory device to set a threshold voltage of the memory device. Applying the program voltage to the gate layer sets a threshold voltage of the memory device which indicates the value stored by the first memory device. FIG. 29 illustrates a cross-sectional view 2900 of some embodiments corresponding to block 3114.

FIG. 32 illustrates a flow diagram of some embodiments of a method 3200 for programming a plurality of memory devices.

At block 3202, apply a first program voltage to a gate layer of a first memory device so that a threshold voltage of the first memory device is equal to a first threshold voltage. For example, the first program voltage is 0 volts so that the threshold voltage of the first memory device is unchanged (e.g., shifted by 0 volts). Thus, the first threshold voltage is the initial threshold voltage of the first memory device. The first threshold voltage represents a first stored value (e.g., 00).

At block 3204, remove the first program voltage from the gate layer of the first memory device.

At block 3206, apply a second program voltage to a gate layer of a second memory device to change a threshold voltage of the second memory device from the first threshold voltage to a second threshold voltage. For example, the first program voltage is a first non-zero voltage (e.g., 1 volt) so that the threshold voltage of the second memory device is changed (e.g., shifted) by a first non-zero amount. Thus, the second threshold voltage is a first shifted threshold voltage. The second threshold voltage represents a second stored value (e.g., 01).

At block 3208, remove the second program voltage from the gate layer of the second memory device.

At block 3210, apply a third program voltage to a gate layer of a third memory device to change a threshold voltage of the third memory device from the first threshold voltage to a third threshold voltage. For example, the third program voltage is a second non-zero voltage (e.g., 1.5 volts) so that the threshold voltage of the third memory device is changed (e.g., shifted) by a second non-zero amount. Thus, the third threshold voltage is a second shifted threshold voltage. The third threshold voltage represents a third stored value (e.g., 10).

At block 3212, remove the third program voltage from the gate layer of the third memory device.

At block 3214, apply a fourth program voltage to a gate layer of a fourth memory device to change a threshold voltage of the fourth memory device from the first threshold voltage to a fourth threshold voltage. For example, the fourth program voltage is a third non-zero voltage (e.g., 2 volts) so that the threshold voltage of the fourth memory device is changed (e.g., shifted) by a third non-zero amount. Thus, the fourth threshold voltage is a third shifted threshold voltage. The fourth threshold voltage represents a fourth stored value (e.g., 11).

At block 3216, remove the fourth program voltage from the gate layer of the fourth memory device. FIG. 17 and FIG. 29 illustrate cross-sectional view 1700 and cross-sectional view 2900, respectively, of some embodiments corresponding to blocks 3202-3216.

Thus, the present disclosure relates to an integrated chip comprising a memory device and a method for forming the integrated chip, the memory device comprising a plurality of charge traps along an interface between a ferroelectric layer and a channel layer.

Accordingly, in some embodiments, the present disclosure relates to an integrated chip. The integrated chip includes a substrate. A gate layer is over the substrate. A channel layer is over the substrate and vertically spaced apart from the gate layer. A ferroelectric layer is directly between the channel layer and the gate layer. A pair of source/drain electrodes are laterally spaced apart over the channel layer. A plurality of charge traps are along an interface between the ferroelectric layer and the channel layer.

In other embodiments, the present disclosure relates to a method. The method includes applying a first program voltage to a gate layer of a first memory device to change a threshold voltage of the first memory device from a first threshold voltage to a second threshold voltage, different from the first threshold voltage. The gate layer is vertically spaced apart from a channel layer by a ferroelectric layer. The threshold voltage of the first memory device corresponds to a value stored by the first memory device. The method further includes removing the first program voltage from the gate layer of the first memory device. The threshold voltage of the first memory device is different from the first threshold voltage after the first program voltage is removed from the gate layer.

In yet other embodiments, the present disclosure relates to a method for forming an integrated chip. The method includes depositing a gate layer over a substrate. A ferroelectric layer is deposited over the substrate. A channel layer is deposited over the substrate. The ferroelectric layer is vertically between the gate layer and the channel layer. A first pair of source/drain electrodes are formed laterally spaced apart over the channel layer. The gate layer, the ferroelectric layer, the channel layer, and the first pair of source/drain electrodes form a first memory device. A first program voltage is applied to the gate layer. A first number of charge carriers become trapped along an interface between the channel layer and the ferroelectric layer in response to the applying of the first program voltage to the gate layer. The first number corresponds to a value stored by the first memory device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
   depositing a gate layer over a substrate;
   depositing a ferroelectric layer over the substrate;
   depositing a channel layer over the substrate, wherein the ferroelectric layer is vertically between the gate layer and the channel layer;
   forming a first pair of source/drain electrodes laterally spaced apart over the channel layer, wherein the gate layer, the ferroelectric layer, the channel layer, and the first pair of source/drain electrodes form a first memory device; and
   applying a first program voltage to the gate layer to cause a first non-zero number of charge carriers to become trapped along an interface between the channel layer and the ferroelectric layer to store a first two-bit value with the first memory device.

2. The method of claim 1, further comprising:
   etching the channel layer to form a first channel layer segment and a second channel layer segment from the channel layer;
   etching the ferroelectric layer to form a first ferroelectric layer segment and a second ferroelectric layer segment from the ferroelectric layer;
   etching the gate layer to form a first gate layer segment and a second gate layer segment from the gate layer, wherein the first pair of source/drain electrodes are directly over the first channel layer segment, and wherein the first channel layer segment, the first ferroelectric layer segment, the first gate layer segment, and the first pair of source/drain electrodes form the first memory device; and
   forming a second pair of source/drain electrodes over the second channel layer segment, wherein the second channel layer segment, the second ferroelectric layer segment, the second gate layer segment, and the second pair of source/drain electrodes form a second memory device laterally spaced apart from the first memory device.

3. The method of claim 2, wherein the first program voltage is applied to the first gate layer segment, and wherein applying the first program voltage to the first gate layer segment shifts a threshold voltage of the first memory device by a first amount, and wherein the method further comprises:
   applying a second program voltage, different from the first program voltage, to the second gate layer segment to shift a threshold voltage of the second memory device by a second amount, different than the first amount.

4. The method of claim 1, wherein the ferroelectric layer is deposited in a trench over the channel layer and laterally between the first pair of source/drain electrodes, and wherein the gate layer is deposited in the trench over the ferroelectric layer and laterally between the first pair of source/drain electrodes.

5. The method of claim 1, wherein the ferroelectric layer is deposited over the gate layer, wherein the channel layer is deposited over the ferroelectric layer, and wherein the first pair of source/drain electrodes are formed over the channel layer, the ferroelectric layer, and the gate layer.

6. The method of claim 1, wherein applying the first program voltage to the gate layer of the first memory device changes a threshold voltage of the first memory device from a first threshold voltage to a second threshold voltage less than the first threshold voltage.

7. The method of claim 6, further comprising:
   applying a second program voltage, different than the first program voltage, to the gate layer of the first memory device to change the threshold voltage of the first memory device from the second threshold voltage to a third threshold voltage, different than the second threshold voltage and the first threshold voltage.

8. The method of claim 6, further comprising:
   applying a read voltage to the gate layer to determine the threshold voltage of the first memory device to determine the value stored by the first memory device.

9. The method of claim 1, further comprising:
   applying a second program voltage, different than the first program voltage, to the gate layer to increase the number of charge carriers trapped along the interface between the channel layer and the ferroelectric layer from the first non-zero number of charge carriers to a second non-zero number of charge carriers, greater than the first non-zero number of charge carriers, to change the value stored by the first memory device from the first two-bit value to a second two-bit value, different than the first two-bit value.

10. A method for forming an integrated chip, the method comprising:
depositing a gate layer over a substrate;
depositing a ferroelectric layer over the gate layer;
depositing a channel layer directly on a top surface of the ferroelectric layer;
forming a first pair of source/drain electrodes laterally spaced apart over the channel layer, wherein the gate layer, the ferroelectric layer, the channel layer, and the first pair of source/drain electrodes form a first memory device; and
applying a first program voltage to the gate layer to change a threshold voltage of the first memory device from a first threshold voltage to a second threshold voltage, different than the first threshold voltage, and wherein the threshold voltage of the first memory device corresponds to a value stored by the first memory device.

11. The method of claim 10, further comprising:
removing the first program voltage from the gate layer of the first memory device, wherein the threshold voltage of the first memory device is different than the first threshold voltage after the first program voltage is removed from the gate layer.

12. The method of claim 10, wherein a plurality of charge traps are along an interface between the ferroelectric layer and the channel layer, wherein applying the first program voltage to the gate layer causes a first number of charge carriers to become trapped in a corresponding first number of the plurality of charge traps.

13. The method of claim 12, wherein the first number of charge carriers remain in the first number of the plurality of charge traps after the first program voltage is removed from the gate layer.

14. The method of claim 10, further comprising:
etching the channel layer to form a first channel structure and a second channel structure from the channel layer;
etching the ferroelectric layer to form a first ferroelectric structure and a second ferroelectric structure from the ferroelectric layer;
etching the gate layer to form a first gate structure and a second gate structure from the gate layer, wherein the first pair of source/drain electrodes are formed laterally spaced apart over the first channel structure, wherein the first gate structure, the first ferroelectric structure, the first channel structure, and the first pair of source/drain electrodes form the first memory device, and wherein the first program voltage is applied to the first gate structure to change the threshold voltage of the first memory device from the first threshold voltage to the second threshold voltage;
forming a second pair of source/drain electrodes laterally spaced apart over the second channel structure, wherein the second gate structure, the second ferroelectric structure, the second channel structure, and the second pair of source/drain electrodes form a second memory device laterally spaced from the first memory device; and
applying a second program voltage, different than the first program voltage, to the second gate structure to change a threshold voltage of the second memory device from the first threshold voltage to a third threshold voltage, different than the first threshold voltage and the second threshold voltage, wherein the threshold voltage of the second memory device corresponds to a value stored by the second memory device.

15. The method of claim 10, wherein forming the first pair of source/drain electrodes comprises depositing a dielectric layer over the channel layer, etching the dielectric layer to form a pair of openings in the dielectric layer and laterally spaced apart over the channel layer, and depositing a metal in the pair of opening to form the first pair of source/drain electrodes.

16. The method of claim 10, wherein a first source/drain electrode of the first pair of source/drain electrodes is on a first upper surface of the channel layer, wherein a second source/drain electrode of the first pair of source/drain electrodes is on a second upper surface of the channel layer, and wherein a top surface of the channel layer is above the first and second upper surfaces of the channel layer and extends from a sidewall of the first source/drain electrode to sidewall of the second source/drain electrode.

17. A method for forming an integrated chip, the method comprising:
depositing a channel layer over a substrate;
depositing a source/drain layer over the channel layer;
etching the source/drain layer to form a first pair of source/drain electrodes from the source/drain layer and to form a trench in the source/drain layer laterally between the first pair of source/drain electrodes;
depositing a ferroelectric layer over the channel layer and in the trench between the first pair of source/drain electrodes;
depositing a gate layer over the ferroelectric layer and in the trench between the first pair of source/drain electrodes, wherein the gate layer, the ferroelectric layer, the channel layer, and the first pair of source/drain electrodes form a first memory device;
applying a first positive program voltage to the gate layer to increase a number of charge carriers trapped along an interface between the channel layer and the ferroelectric layer from a first number of charge carriers to a second number of charge carriers, greater than the first number of charge carriers, to change a value stored by the first memory device from a first value to a second value different than the first value; and
applying a second positive program voltage, greater than the first positive program voltage, to the gate layer to increase the number of charge carriers trapped along the interface between the channel layer and the ferroelectric layer from the second number of charge carriers to a third number of charge carriers, greater than the second number of charge carriers, to change the value stored by the first memory device from the second value to a third value different than the first value and the second value.

18. The method of claim 17, further comprising:
etching the channel layer and the source/drain layer to form a first channel and source/drain stack and to form a second channel and source/drain stack, spaced from the first channel and source/drain stack, before etching the source/drain layer to form the first pair of source/drain electrodes.

19. The method of claim 17, wherein the ferroelectric layer is deposited along a sidewall of a first source/drain electrode of the first pair of source/drain electrodes, an upper surface of the channel layer, and a sidewall of a second source/drain electrode of the first pair of source/drain electrodes, and wherein the gate layer is deposited over an upper surface of the ferroelectric layer and directly between sidewalls of the ferroelectric layer.

20. The method of claim 17, wherein a first source/drain electrode of the first pair of source/drain electrodes is on a first top surface of the channel layer, wherein a second source/drain electrode of the first pair of source/drain electrodes is on a second top surface of the channel layer, and wherein the ferroelectric layer is on an upper surface of the channel layer that is below and between the first and second top surfaces of the channel layer.

* * * * *